United States Patent
Zhu et al.

(10) Patent No.: US 11,056,070 B2
(45) Date of Patent: Jul. 6, 2021

(54) ENCODING METHOD AND DEVICE, DECODING METHOD AND DEVICE, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Hao Zhu, Beijing (CN); Xin Wang, Beijing (CN); Xibin Shao, Beijing (CN); Ming Chen, Beijing (CN); Jieqiong Wang, Beijing (CN); Shou Li, Beijing (CN); Yifang Chu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/620,168

(22) PCT Filed: Jun. 1, 2018

(86) PCT No.: PCT/CN2018/089549
§ 371 (c)(1),
(2) Date: Dec. 6, 2019

(87) PCT Pub. No.: WO2018/223899
PCT Pub. Date: Dec. 13, 2018

(65) Prior Publication Data
US 2020/0090615 A1 Mar. 19, 2020

(30) Foreign Application Priority Data
Jun. 9, 2017 (CN) .......................... 201710434609.3

(51) Int. Cl.
*G09G 3/36* (2006.01)
*H03M 7/30* (2006.01)
*H03K 19/20* (2006.01)

(52) U.S. Cl.
CPC ............ *G09G 3/3685* (2013.01); *H03M 7/30* (2013.01); *G09G 2310/0202* (2013.01);
(Continued)

(58) Field of Classification Search
CPC .......... H03K 19/20; H03M 7/16; H03M 7/20; H03M 7/22; H03M 7/30; H03M 7/40;
(Continued)

(56) References Cited

U.S. PATENT DOCUMENTS

| 5,144,304 A * | 9/1992 | McMahon ............ H04L 1/0042 341/58 |
| 6,198,413 B1 * | 3/2001 | Widmer .................. H03M 5/00 341/58 |

(Continued)

FOREIGN PATENT DOCUMENTS

| CN | 101847997 A | 9/2010 |
| CN | 102611951 A | 7/2012 |

(Continued)

OTHER PUBLICATIONS

International Preliminary Report on Patentability received for PCT Patent Application No. PCT/CN2018/089549, dated Dec. 19, 2019, 12 pages (7 pages of English Translation and 5 pages of Original Document).

(Continued)

*Primary Examiner* — Young T. Tse
(74) *Attorney, Agent, or Firm* — Womble Bond Dickinson (US) LLP

(57) ABSTRACT

This application relates to an encoding method and device, a decoding method and device, and a signal transmission
(Continued)

system. The encoding method includes: encoding 8-bit data corresponding to a to-be-encoded byte of to-be-transmitted data into 9-bit data, the to-be-transmitted data comprising at least one to-be-encoded byte; detecting the first digit of data of the 9-bit data and a previous digit of data adjacent to the first digit of data, when the to-be-encoded byte is not the first byte of the to-be-transmitted data; inverting the 9-bit data and then adding a tenth digit of data for indicating that the inverted 9-bit data has undergone an inversion operation behind the inverted 9-bit data to obtain 10-bit data, when the numerical value of the first digit of data is the same as that of the previous digit of data; and adding a tenth digit of data for indicating that the 9-bit data has not undergone an inversion operation behind the 9-bit data to obtain 10-bit data, when the numerical value of the first digit of data is different from that of the previous digit of data.

20 Claims, 11 Drawing Sheets

(52) U.S. Cl.
CPC ..... *G09G 2310/08* (2013.01); *G09G 2370/08* (2013.01); *H03K 19/20* (2013.01)

(58) Field of Classification Search
CPC ............ H03M 7/4006; H03M 7/4012; H03M 7/4018; H03M 7/4031; H03M 7/4037; H03M 7/4043; H03M 7/4087; H03M 7/4093; H09G 3/3685; H09G 2310/0202; H09G 2310/08; H09G 2370/08
USPC ....... 375/240–242, 246, 253, 265, 295, 316; 341/52, 53, 56, 67, 178, 184
See application file for complete search history.

(56) References Cited

U.S. PATENT DOCUMENTS

| | | | |
|---|---|---|---|
| 6,606,360 | B1 | 8/2003 | Dunning et al. |
| 6,747,580 | B1* | 6/2004 | Schmidt ................ H03M 5/145 341/106 |
| 6,897,793 | B1 | 5/2005 | Kim et al. |
| 6,914,637 | B1* | 7/2005 | Wolf .................. H04N 21/2383 348/473 |
| 7,190,738 | B2 | 3/2007 | Neugebauer et al. |
| 7,295,578 | B1 | 11/2007 | Lyle et al. |
| 2003/0048852 | A1* | 3/2003 | Hwang .................. H04L 1/206 375/240.26 |
| 2009/0276683 | A1* | 11/2009 | Toyoda ................. H03M 13/19 714/752 |
| 2014/0340579 | A1 | 11/2014 | Choi et al. |
| 2017/0154597 | A1* | 6/2017 | Iwami .................. G09G 3/3648 |

FOREIGN PATENT DOCUMENTS

| | | |
|---|---|---|
| CN | 104052577 A | 9/2014 |
| CN | 105531687 A | 4/2016 |

OTHER PUBLICATIONS

International Search Report and Written Opinion received for PCT Patent Application No. PCT/CN2018/089549, dated Aug. 10, 2018, 14 pages (7 pages of English Translation and 7 pages of Original Document).
First Office Action received for Chinese Patent Application No. 201710434609.3, dated Oct. 9, 2020, 18 pages (9 pages of English Translation and 9 pages of Original Document).
Supplementary European Search Report and Search Opinion received for EP Patent Application No. 18813570.1, dated Feb. 3, 2021, 9 pages.

* cited by examiner

ENCODING METHOD AND DEVICE, DECODING METHOD AND DEVICE, AND DISPLAY DEVICE

CROSS REFERENCE TO RELATED APPLICATIONS

The present application is a 35 U.S.C. 371 national stage application of PCT International Application No. PCT/CN2018/089549, filed on Jun. 1, 2018, which claims the benefit of Chinese Patent Application No. 201710434609.3, filed on Jun. 9, 2017, the entire disclosures of which are incorporated herein by reference.

TECHNICAL FIELD

This application relates to the field of panel manufacturing, and in particular, to an encoding method and device, a decoding method and device, and a signal transmission system.

BACKGROUND

A driving part of a liquid crystal display panel generally includes a timing controller, a source driver and a gate driver, wherein the main function of the timing controller is to process each frame of image data to generate a data signal and a control signal corresponding to each frame of image data, the data signal is communicated to the source driver, and the source driver converts the received data signal into a data voltage to be written to a corresponding pixel on the liquid crystal display panel.

With the increase of the resolution of the liquid crystal display panel, the rate of data transmission between the timing controller and the source driver in the liquid crystal display panel is higher and higher, and nowadays, there is an 8b/10b (i.e., encoding 8-bit data into 10-bit data) encoding method for high speed data transmission. In particular, 8-bit original data is divided into two parts, 5b/6b (i.e., encoding 5-bit data into 6-bit data) encoding is performed on the first 5 digits thereof, and 3b/4b (i.e., encoding 3-bit data into 4-bit data) encoding is performed on the last 3 digits thereof.

However, with the development of codec technology, in the current field of timing control, there are usually two approaches for signal transmission, Phase Locked Loop (PLL for short) and Delay-locked Loop (DLL for short), wherein the PLL is more common, and the DLL requires that a jumping edge needs to occur in a transmission procedure. However, the above-mentioned encoding method only supports the PLL transmission approach and not the DLL transmission approach.

SUMMARY

To solve the problem that the existing 8b/10b encoding method cannot support the PLL and the DLL simultaneously, embodiments of this application provide an encoding method and device, a decoding method and device, and a signal transmission system. The technical solutions are as follows.

In a first aspect, there is provided an encoding method comprising: encoding 8-bit data corresponding to a to-be-encoded byte of to-be-transmitted data into 9-bit data, the to-be-transmitted data comprising at least one to-be-encoded byte; detecting the first digit of data of the 9-bit data and a previous digit of data adjacent to the first digit of data, when the to-be-encoded byte is not the first byte of the to-be-transmitted data; inverting the 9-bit data and then adding a tenth digit of data for indicating that the inverted 9-bit data has undergone an inversion operation behind the inverted 9-bit data to obtain 10-bit data, when the numerical value of the first digit of data is the same as that of the previous digit of data; and adding a tenth digit of data for indicating that the 9-bit data has not undergone an inversion operation behind the 9-bit data to obtain 10-bit data, when the numerical value of the first digit of data is different from that of the previous digit of data; wherein all the said data is binary data.

In an embodiment, at least one of any 5 consecutive digits of the 9-bit data is different from the other digits, and the encoding 8-bit data corresponding to a to-be-encoded byte of to-be-transmitted data into 9-bit data includes encoding the 8-bit data into the 9-bit data as follows:

enc[0]=d[3];
enc[1]=(~d[2]&d[1])|(d[2]&d[1]&~d[3])|(~d[2]&~d[0]);
enc[2]=(d[2]&~d[1])|(d[2]&d[1]&~d[3])|(~d[1]&d[0]);
enc[3]=d[5];
enc[4]=d[6];
enc[5]=(~d[2]&~d[1]&~d[4])|(d[2]&~d[0])|(d[1]&~d[0]);
enc[6]=(~d[2]&~d[1]&~d[4])|(d[2]&d[0])|(d[1]&d[0]);
enc[7]=d[4];
enc[8]=d[7];

wherein enc[i] is the (i+1)-th digit in the 9-bit data, $8 \geq i \geq 0$, and i is an integer; d[j] is the (j+1)-th digit in the 8-bit data, $7 \geq j \geq 0$, and j is an integer; and ~ represents performing an inversion operation, & represents performing an AND operation, and | represents performing an OR operation.

In an embodiment, when the tenth digit of data is 1, it indicates that the 9-bit data has undergone an inversion operation, and when the tenth digit of data is 0, it indicates that the 9-bit data has not undergone an inversion operation.

Accordingly, when the numerical value of the first digit of data is the same as that of the previous digit of data (e.g., both the first digit of data and the previous digit of data are 0, or both the first digit of data and the previous digit of data are 1), the 9-bit data is inverted and then a tenth digit of data (i.e., 1) for indicating that the inverted 9-bit data has undergone an inversion operation is added behind the inverted 9-bit data to obtain 10-bit data. When the numerical value of the first digit of data is different from that of the previous digit of data (e.g., one of the first digit of data and the previous digit of data is 0, and the other is 1), a tenth digit of data (i.e., 0) for indicating that the 9-bit data has not undergone an inversion operation is added behind the 9-bit data to obtain 10-bit data.

In an embodiment, after the encoding 8-bit data corresponding to a to-be-encoded byte into 9-bit data, the method further includes: detecting whether the first digit of data of the 9-bit data is 0 when the to-be-encoded byte is the first byte of the to-be-transmitted data; inverting the 9-bit data and then adding a tenth digit of data for indicating that the inverted 9-bit data has undergone an inversion operation behind the inverted 9-bit data to obtain 10-bit data, when the first digit of data is 0; and adding a tenth digit of data for indicating that the 9-bit data has not undergone an inversion operation behind the 9-bit data to obtain 10-bit data, when the first digit of data is not 0.

In an embodiment, the method further includes: adding a first identification code at a preset position of the encoded to-be-transmitted data to obtain target data, the first identification code being preset 10-bit data, the first identification code comprising at least 6 consecutive digits of identical data, the first identification code being used for identifying transmitted content, start of transmission or end of transmission, and the encoded to-be-transmitted data comprising the 10-bit data obtained by encoding the 8-bit data corresponding to the to-be-encoded byte; and sending the target data.

In an embodiment, the first identification code and a second identification code are spliced into a combined code, the second identification code is also preset 10-bit data, the second identification code also includes at least 6 consecutive digits of identical data, but the second identification code is different from the first identification code; and the combined code is added at a preset position of the encoded to-be-transmitted data to obtain target data.

In a second aspect, there is provided a decoding method comprising: detecting the tenth digit of data of to-be-decoded 10-bit data, the tenth digit of data being used for indicating whether the first 9 bits of data in the to-be-decoded 10-bit data have undergone an inversion operation; inverting the first 9 bits of data to obtain pre-decoded 9-bit data, when the tenth digit of data indicates that the first 9 bits of data have undergone an inversion operation; taking the first 9 bits of data as pre-decoded 9-bit data, when the tenth digit of data indicates that the first 9 bits of data have not undergone an inversion operation; and decoding the pre-decoded 9-bit data into 8-bit data; wherein all the said data is binary data.

In an embodiment, at least one of any 5 consecutive digits of the pre-decoded 9-bit data is different from the other digits, and the decoding the pre-decoded 9-bit data into 8-bit data includes decoding the pre-decoded 9-bit data into the 8-bit data as follows:

Dout[7]=d_code[8];
Dout[6]=d_code[4];
Dout[5]=d_code[3];
Dout[4]=d_code[7];
Dout[3]=d_code[0];
Dout[2]=(d_code[6]^d_code[5])&~(~d_code[2]&d_code[1]);
Dout[1]=(d_code[6]^d_code[5])&~(d_code[2]&~d_code[1]);
Dout[0]=(d_code[6]&~d_code[5])|(d_code[6]&d_code[5]&d_code[2])|(~d_code[6]&~d_code[5]&d_code[2]);

wherein d_code[i] is the (i+1)-th digit in the 9-bit data, 8≥i≥0, and i is an integer; Dout[j] is the (j+1)-th digit in the 8-bit data, 7≥j≥0, and j is an integer; and ^ represents performing an exclusive OR operation, ~ represents performing an inversion operation, & represents performing an AND operation, and | represents performing an OR operation.

In an embodiment, when the tenth digit of data is 1, it indicates that the 9-bit data has undergone an inversion operation, and when the tenth digit of data is 0, it indicates that the 9-bit data has not undergone an inversion operation.

In an embodiment, before the detecting the tenth digit of data of to-be-decoded 10-bit data, the method further includes:

receiving target data; and
determining to-be-decoded data according to a first identification code when it is detected that the target data includes the first identification code, the to-be-decoded data comprising at least one set of to-be-decoded 10-bit data, the first identification code being preset 10-bit data, the first identification code comprising at least 6 consecutive digits of identical data, and the first identification code being used for identifying transmitted content, start of transmission or end of transmission.

In an embodiment, after the receiving target data, the method further includes:

determining a first identification code according to a combined code when it is detected that the target data includes the combined code, and determining to-be-decoded data according to the first identification code;

wherein the combined code is obtained by splicing the first identification code and second identification code, the second identification code is also preset 10-bit data, the second identification code also includes at least 6 consecutive digits of identical data, and the second identification code is different from the first identification code.

In a third aspect, there is provided an encoding device comprising: an encoder for encoding 8-bit data corresponding to a to-be-encoded byte of to-be-transmitted data into 9-bit data, the to-be-transmitted data comprising at least one to-be-encoded byte; a detector for detecting the first digit of data of the 9-bit data and a previous digit of data adjacent to the first digit of data, when the to-be-encoded byte is not the first byte of the to-be-transmitted data; the encoder being further used for: inverting the 9-bit data and then adding a tenth digit of data for indicating that the inverted 9-bit data has undergone an inversion operation behind the inverted 9-bit data to obtain 10-bit data, when the numerical value of the first digit of data is the same as that of the previous digit of data; and adding a tenth digit of data for indicating that the 9-bit data has not undergone an inversion operation behind the 9-bit data to obtain 10-bit data, when the numerical value of the first digit of data is different from that of the previous digit of data; wherein all of the 8-bit data, the 9-bit data and the 10-bit data is binary data.

In an embodiment, the encoder is specifically used for encoding the 8-bit data into the 9-bit data as follows, such that at least one of any 5 consecutive digits of the 9-bit data is different from the other digits:

enc[0]=d[3];
enc[1]=(~d[2]&d[1])|(d[2]&d[1]&~d[3])|(~d[2]&~d[0]);
enc[2]=(d[2]&~d[1])|(d[2]&d[1]&~d[3])|(~d[1]&d[0]);
enc[3]=d[5];
enc[4]=d[6];
enc[5]=(~d[2]&~d[1]&~d[4])|(d[2]&~d[0])|(d[1]&~d[0]);
enc[6]=(~d[2]&~d[1]&~d[4])|(d[2]&d[0])|(d[1]&d[0]);
enc[7]=d[4];
enc[8]=d[7];

wherein enc[i] is the (i+1)-th digit in the 9-bit data, 8≥i≥0, and i is an integer; d[j] is the (j+1)-th digit in the 8-bit data, 7≥j≥0, and j is an integer; and ~ represents performing an inversion operation, & represents performing an AND operation, and | represents performing an OR operation.

In an embodiment, when the tenth digit of data is 1, it indicates that the 9-bit data has undergone an inversion operation, and when the tenth digit of data is 0, it indicates that the 9-bit data has not undergone an inversion operation.

Accordingly, when both the first digit of data and the previous digit of data are 0, or both the first digit of data and the previous digit of data are 1, the 9-bit data is inverted and then a tenth digit of data for indicating that the inverted 9-bit data has undergone an inversion operation and being 1 is added behind the inverted 9-bit data to obtain 10-bit data. When one of the first digit of data and the previous digit of data is 0, and the other is 1, a tenth digit of data for indicating that the 9-bit data has not undergone an inversion operation and being 0 is added behind the 9-bit data to obtain 10-bit data.

In an embodiment, the encoder is further used for: detecting whether the first digit of data of the 9-bit data is 0 when the to-be-encoded byte is the first byte of the to-be-transmitted data; inverting the 9-bit data and then adding a tenth digit of data for indicating that the inverted 9-bit data has undergone an inversion operation behind the inverted 9-bit data to obtain 10-bit data, when the first digit of data is 0; and adding a tenth digit of data for indicating that the 9-bit data has not undergone an inversion operation behind the 9-bit data to obtain 10-bit data, when the first digit of data is not 0.

In an embodiment, the device further includes: a processor for adding a first identification code at a preset position of the encoded to-be-transmitted data to obtain target data, the first identification code being preset 10-bit data, the first identification code comprising at least 6 consecutive digits of identical data, the first identification code being used for identifying transmitted content, start of transmission or end of transmission, and the encoded to-be-transmitted data comprising the 10-bit data obtained by encoding the 8-bit data corresponding to the to-be-encoded byte; and a sender for sending the target data.

In an embodiment, the processor is specifically used for splicing the first identification code and a second identification code into a combined code, the second identification code being also preset 10-bit data, the second identification code also comprising at least 6 consecutive digits of identical data, and the second identification code being different from the first identification code; and adding the combined code at a preset position of the encoded to-be-transmitted data to obtain target data.

In a fourth aspect, there is provided a decoding device comprising: a detector for detecting the tenth digit of data of to-be-decoded 10-bit data, the tenth digit of data being used for indicating whether the first 9 bits of data in the to-be-decoded 10-bit data have undergone an inversion operation; and a decoder for: inverting the first 9 bits of data to obtain pre-decoded 9-bit data, when the tenth digit of data indicates that the first 9 bits of data have undergone an inversion operation; taking the first 9 bits of data as pre-decoded 9-bit data, when the tenth digit of data indicates that the first 9 bits of data have not undergone an inversion operation; and decoding the pre-decoded 9-bit data into 8-bit data; wherein all the said data is binary data.

In an embodiment, at least one of any 5 consecutive digits of the pre-decoded 9-bit data is different from the other digits, and the decoder is specifically used for decoding the pre-decoded 9-bit data into the 8-bit data as follows:

Dout[7]=d_code[8];
Dout[6]=d_code[4];
Dout[5]=d_code[3];
Dout[4]=d_code[7];
Dout[3]=d_code[0];
Dout[2]=(d_code[6]^d_code[5])&~(~d_code[2]&d_code[1]);
Dout[1]=(d_code[6]^d_code[5])&~(d_code[2]&~d_code[1]);
Dout[0]=(d_code[6]&~d_code[5])|(d_code[6]&d_code[5]&d_code[2])|(~d_code[6]&~d_code[5]&d_code[2]);

wherein d_code[i] is the (i+1)-th digit in the pre-decoded 9-bit data, 8≥i≥0, and i is an integer; Dout[j] is the (j+1)-th digit in the 8-bit data, 7≥j≥0, and j is an integer; and ^ represents performing an exclusive OR operation, ~ represents performing an inversion operation, & represents performing an AND operation, and | represents performing an OR operation.

In an embodiment, when the tenth digit of data is 1, it indicates that the 9-bit data has undergone an inversion operation, and when the tenth digit of data is 0, it indicates that the 9-bit data has not undergone an inversion operation.

In an embodiment, the device further includes: a receiver for receiving target data; and a processor for determining to-be-decoded data according to a first identification code when it is detected that the target data includes the first identification code, the to-be-decoded data comprising at least one set of to-be-decoded 10-bit data, the first identification code being preset 10-bit data, the first identification code comprising at least 6 consecutive digits of identical data, and the first identification code being used for identifying transmitted content, start of transmission or end of transmission.

In an embodiment, the processor is further used for determining a first identification code according to a combined code when it is detected that the target data includes the combined code, and determining to-be-decoded data according to the first identification code; wherein the combined code is obtained by splicing the first identification code and second identification code, the second identification code is also preset 10-bit data, the second identification code also includes at least 6 consecutive digits of identical data, and the second identification code is different from the first identification code.

In a fifth aspect, there is provided a signal transmission system comprising a timing controller and a source driver chip, the timing controller comprising any of the encoding devices as described in the third aspect, and the source driver chip comprising any of the decoding devices as described in the fourth aspect. Or, there is provided a signal transmission system comprising a timing controller and a source driver chip, the timing controller comprising any of the decoding devices as described in the fourth aspect, and the source driver chip comprising any of the encoding devices as described in the third aspect.

For the encoding method and device, the decoding method and device, and the signal transmission system provided by the individual embodiments of the disclosure, at the time of data encoding, 8-bit data is encoded into 9-bit data first, and then a tenth digit is added to obtain 10-bit data; and a jumping edge is arranged between every two adjacent 10-bit data, and the tenth digit of data is used for indicating whether the 9-bit data has undergone an inversion operation, which can effectively ensure that the to-be-transmitted data can be correctly recovered at a receiving end, and the jumping edge may effectively reduce transmission errors. Moreover, the encoding approach as described above meets the requirements of the PLL and the DLL simultaneously, such that the receiving end can support the signal transmission approaches of the PLL and the DLL simultaneously.

It will be appreciated that, the above general description and the following detailed description is just exemplary, and cannot limit this application.

BRIEF DESCRIPTION OF THE DRAWINGS

In order to more clearly illustrate the embodiments of this application, the appended drawings needing to be used in the description of the embodiments will be introduced briefly in the following. Obviously, the drawings in the following description are only some embodiments of this application, and for the person having ordinary skills in the art, other drawings may also be obtained according to these drawings under the premise of not paying out undue experimentation.

The drawings herein are incorporated into the specification and constitute a part of the specification, show embodiments in accordance with this application, and are used for explaining the principle of this application along with the specification.

DETAILED DESCRIPTION

To make the objects, technical solutions and advantages of this application clearer, in the following, this application will be further described in detail in conjunction with the drawings. Obviously, the described embodiments are just a part of embodiments of this application, and not all the embodiments. Based on the embodiments in this application, all the other embodiments obtained by the person having ordinary skills in the art under the premise of not paying out undue experimentation pertain to the scope protected by this application.

Figure 1:
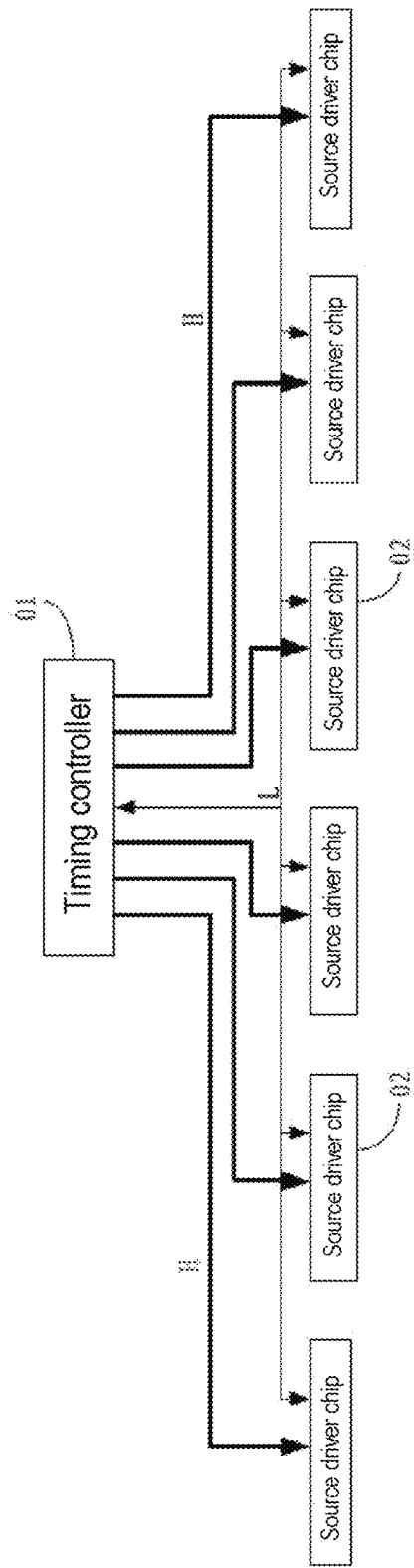
FIG. 1 is a schematic diagram of an application environment of an encoding method and a decoding method provided by an embodiment of the disclosure.

Reference is made to FIG. 1, which is a schematic diagram of an application environment of an encoding method and a decoding method provided by an embodiment of the disclosure. As shown in FIG. 1, the encoding and decoding methods are applied in a display device, the display device includes a timing controller 01 and a plurality of source driver chips 02, a plurality of first signal lines H of the timing controller 01 are coupled to the plurality of source driver chips 02 in a one to one correspondence, the timing controller is also coupled to a second signal line L, and the plurality of source driver chips 02 are connected in parallel and coupled to the second signal line L. The signal transmission rate of a first signal line is less than that of the second signal line, the first signal line may be called a low speed signal line and is usually used for identifying a level state, and the second signal line may be called a high speed signal line and is usually used for transmitting a high speed differential signal.

In an embodiment of the disclosure, there is provided a new 8b/10b (i.e., encoding 8-bit data into 10-bit data) encoding method, wherein both the 8-bit data before the encoding and the 10-bit data after the encoding is binary data, data transmitted between the timing controller 01 and a source driver chip 02 may be encoded by adopting the encoding method, and the data transmitted between the timing controller 01 and the source driver chip 02 may be data transmitted in a first signal line, or may also be data transmitted in the second signal line, which will not be limited by the embodiment of the disclosure.

Figure 2:
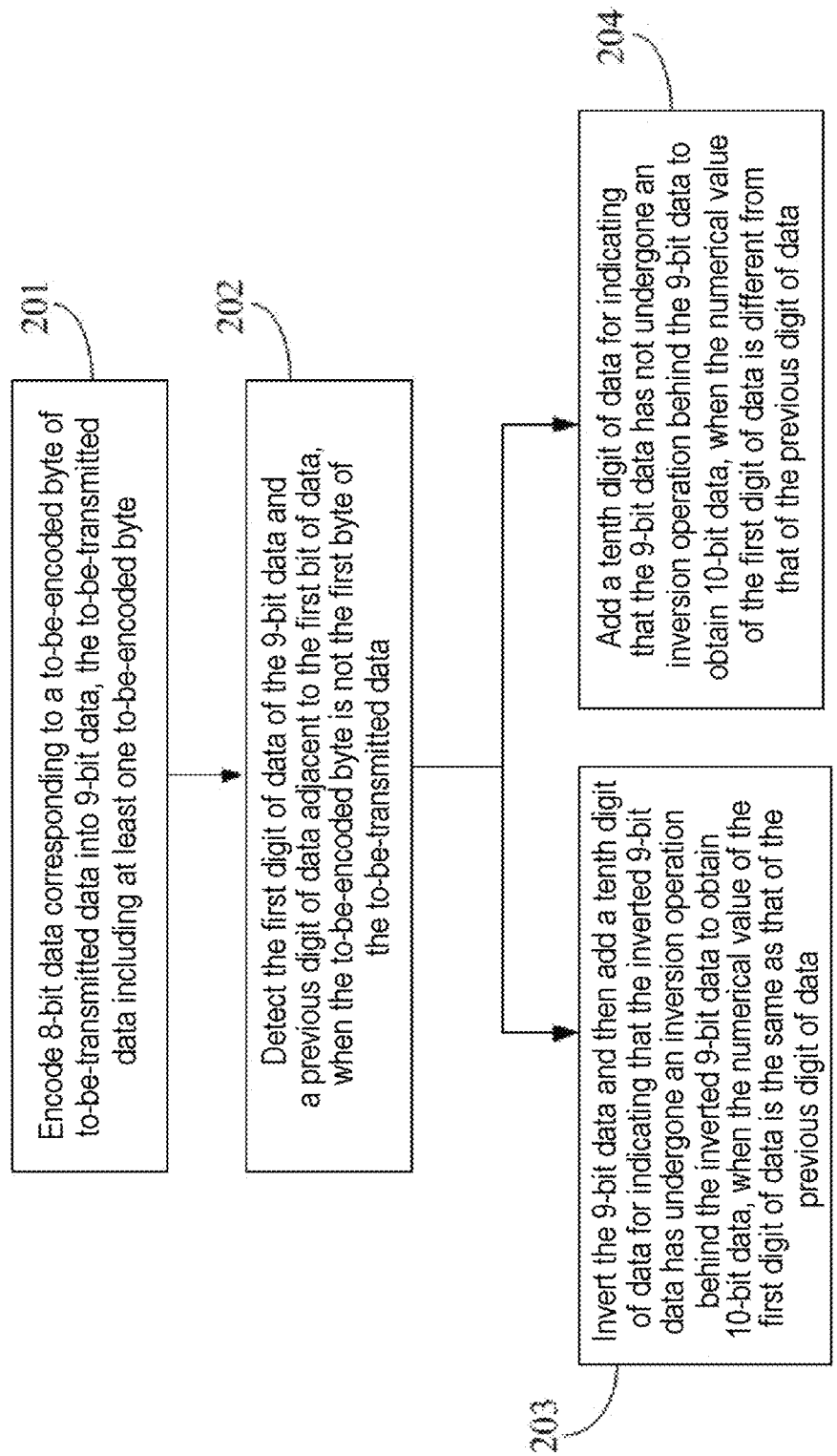
FIG. 2 is a flow diagram of an encoding method shown according to an exemplary embodiment.

As shown in FIG. 2, FIG. 2 is a flow diagram of an encoding method provided by one embodiment of the disclosure, which may be applied in the environment as shown in FIG. 1. The method includes: step 201, encoding 8-bit data corresponding to a to-be-encoded byte of to-be-transmitted data into 9-bit data, the to-be-transmitted data comprising at least one to-be-encoded byte; step 202, detecting the first digit of data of the 9-bit data and a previous digit of data adjacent to the first bit of data, when the to-be-encoded byte is not the first byte of the to-be-transmitted data; step 203, inverting the 9-bit data and then adding a tenth digit of data for indicating that the inverted 9-bit data has undergone an inversion operation behind the inverted 9-bit data to obtain 10-bit data, when the numerical value of the first digit of data is the same as that of the previous digit of data; and step 204, adding a tenth digit of data for indicating that the 9-bit data has not undergone an inversion operation behind the 9-bit data to obtain 10-bit data, when the numerical value of the first digit of data is different from that of the previous digit of data; wherein all the said data is binary data, and the tenth digit of data is used for indicating whether the 9-bit data has undergone an inversion operation.

For the encoding method provided by the one embodiment of the disclosure, at the time of data encoding, 8-bit data is encoded into 9-bit data first, and then a tenth digit is added to obtain 10-bit data; and a jumping edge is arranged between every two adjacent 10-bit data, and the tenth digit of data is used for indicating whether the 9-bit data has undergone an inversion operation, which can effectively ensure that the to-be-transmitted data can be correctly recovered at a receiving end, and the jumping edge may effectively reduce transmission errors. Moreover, the encoding approach as described above meets the requirements of the PLL and the DLL simultaneously, such that the receiving end can support the signal transmission approaches of the PLL and the DLL simultaneously.

Figure 3:
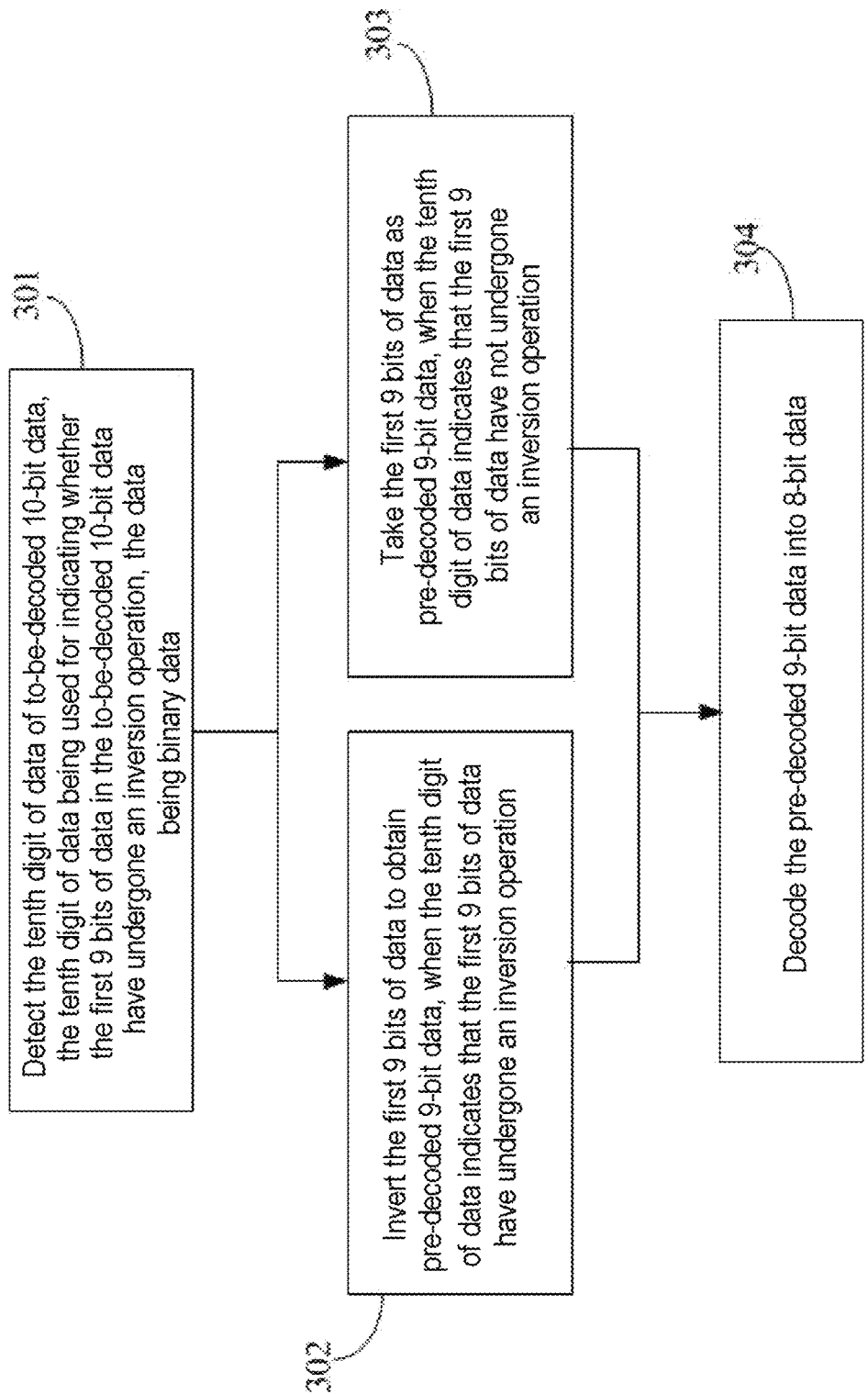
FIG. 3 is a flow diagram of a decoding method shown according to an exemplary embodiment.

As shown in FIG. 3, FIG. 3 is a flow diagram of a decoding method provided by one embodiment of the disclosure, which may be applied in the environment as shown in FIG. 1. The method includes: step 301, detecting the tenth digit of data of to-be-decoded 10-bit data, the tenth digit of data being used for indicating whether the first 9 bits of data in the to-be-decoded 10-bit data have undergone an inversion operation; step 302, inverting the first 9 bits of data to obtain pre-decoded 9-bit data, when the tenth digit of data indicates that the first 9 bits of data have undergone an inversion operation; step 303, taking the first 9 bits of data as pre-decoded 9-bit data, when the tenth digit of data indicates that the first 9 bits of data have not undergone an inversion operation; and step 304, decoding the pre-decoded 9-bit data into 8-bit data; wherein all the said data is binary data.

For the decoding method provided by the one embodiment of the disclosure, at the time of data decoding, the 10-bit data is decoded into 9-bit data according to the tenth digit of data first, and then the 9-bit data is decoded into 8-bit data, which can effectively ensure that the transmitted data can be correctly recovered at a receiving end, and the jumping edge may effectively reduce transmission errors. Moreover, the decoding approach as described above meets the requirements of the PLL and the DLL simultaneously, such that the receiving end can support the signal transmission approaches of the PLL and the DLL simultaneously.

Figure 4A:
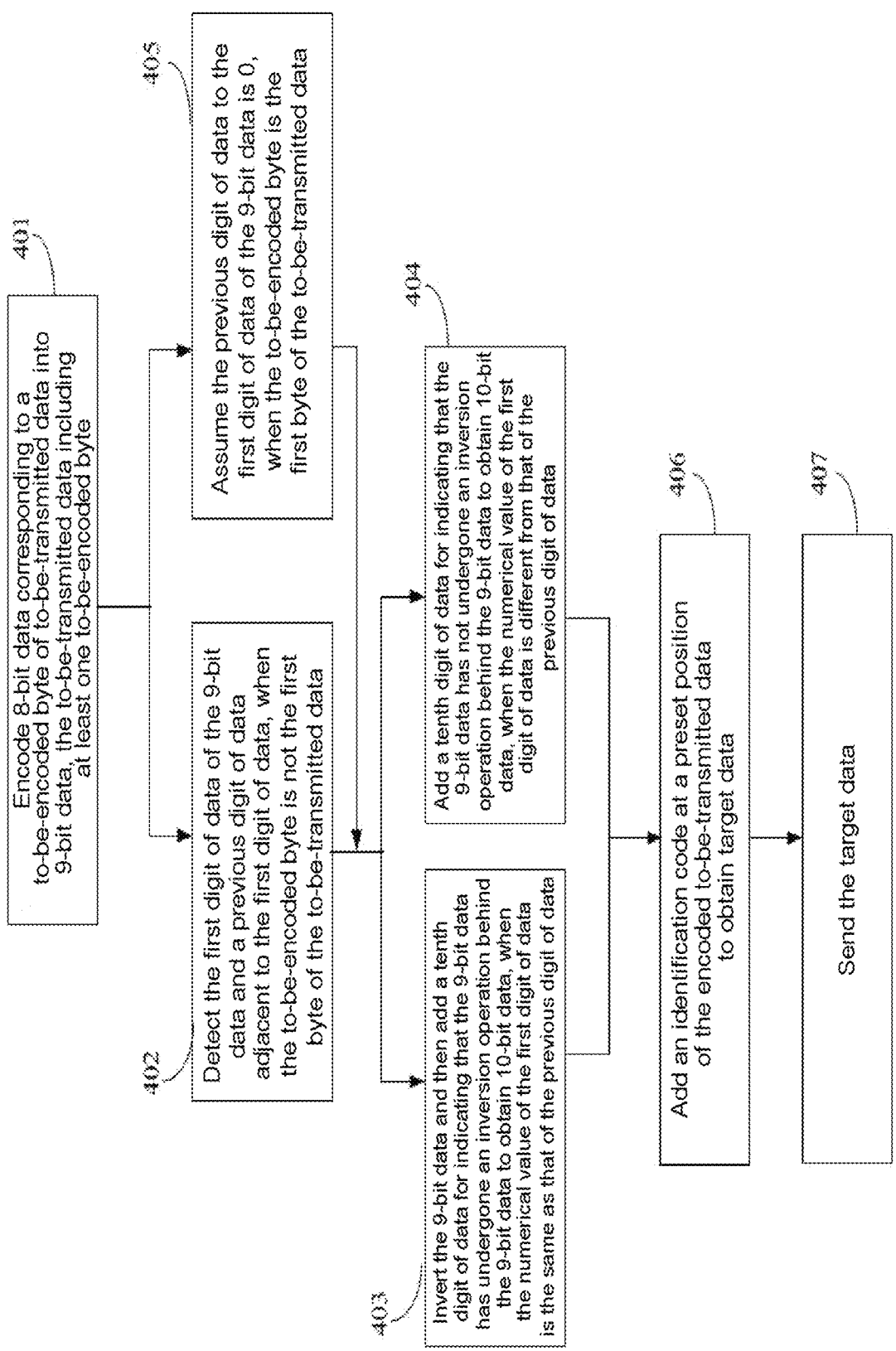
FIG. 4a is a flow diagram of another encoding method shown according to an exemplary embodiment.

An embodiment of the disclosure provides an encoding method, as shown in FIG. 4a, the method may be applied in the environment as shown in FIG. 1, and the method includes: step 401, encoding 8-bit data corresponding to a to-be-encoded byte of to-be-transmitted data into 9-bit data, the to-be-transmitted data comprising at least one to-be-encoded byte; and then performing step 402 or step 405 according to the situation.

Before data transmission, it is necessary to encode to-be-transmitted data, the to-be-transmitted data includes at least one to-be-encoded byte, and each to-be-encoded byte is 8-bit data. It is noted that, in an embodiment of the disclosure, at a sending end of data, the bit digits of the data are arranged in an order from low digit to high digit. For example, the arrangement order of data 10000010 is from right to left, that is, its first digit of data is 0, its last digit of data is 1, "1000" is its 4 high digits, and "0010" is its 4 low digits.

In particular, a procedure of encoding 8-bit data corresponding to a to-be-encoded byte of to-be-transmitted data into 9-bit data includes:

encoding the 8-bit data into the 9-bit data as follows:
enc[0]=d[3];
enc[1]=(~d[2]&d[1])|(d[2]&d[1]&~d[3])|(~d[2]&~d[0]);
enc[2]=(d[2]&~d[1])|(d[2]&d[1]&d[3])|(~d[1]&d[0]);
enc[3]=d[5];
enc[4]=d[6];
enc[5]=(~d[2]&~d[1]&~d[4])|(d[2]&~d[0])|(d[1]&~d[0]);
enc[6]=(~d[2]&~d[1]&~d[4])|(d[2]&d[0])|(d[1]&d[0]);
enc[7]=d[4];
enc[8]=d[7];

wherein enc[i] is the (i+1)-th digit in the 9-bit data, 8≥i≥0, and i is an integer; d[j] is the (j+1)-th digit in the 8-bit data, 7≥j≥0, and j is an integer; and ~ represents performing an inversion operation, & represents performing an AND operation, and | represents performing an OR operation. The inversion operation represents inverting a binary digit, for example, 1 is inverted to 0, and 0 is inverted to 1. The AND operation represents two binary digits AND each other, and its rule is that it is true only if both the former and the latter are 1, otherwise, it is false, wherein true is 1, false is 0, and then 1&1=1, 1&0=0, 0&1=0, 0&0=0. The OR operation represents two binary digits OR each other, and its rule is that it is true if only one of the former and the latter is 1, wherein true is 1, false is 0, and then 1||=1, 1|0=1, 0||=1, 0|0=0.

Figure 4B:
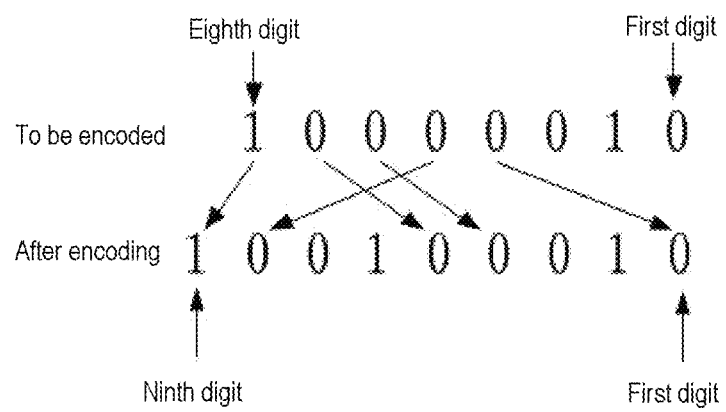
FIG. 4b is a schematic diagram of an 8b/9b encoding approach shown according to an exemplary embodiment.

Exemplarily, as shown in FIG. 4b, assume that the to-be-encoded 8-bit data is 10000010, and its first digit of data to the eighth digit of data are successively 0, 1, 0, 0, 0, 0, 0, 1. Then, it may be encoded into 9-bit data 100100010 according to the above encoding approach, wherein in the 9-bit data, the first digit of data enc[0]=d[3]=0;
the second digit of data enc[1]=(~d[2]&d[1])|(d[2]&d[1]&~d[3])|(~d[2]&~d[0])=(~0&1)|(0& 1&~0)|(~0&~0)= (1&1)|(0&1&1)|(1&1)=1|0|1=1;
the third digit of data enc[2]=(d[2]&~d[1])|(d[2]&d[1]&~d[3])|(~d[1]&d[0])=(0&~1)|(0& 1&~0)|(~1&0)=(0&0)| (0&1&1)|(0&0)=0|0|0=0;
the fourth digit of data enc[3]=d[5]=0;
the fifth digit of data enc[4]=d[6]=0;
the sixth digit of data enc[5]=(~d[2]&~d[1]&~d[4])|(d[2]&~d[0])|(d[1]&~d[0])=(~0&~1&~0)|(0&~0)|(1&~0)= (1&0&1)|(0&1)|(1&1)=0|0|1=1;
the seventh digit of data enc[6]=(~d[2]&~d[1]&~d[4])|(d[2]&d[0])|(d[1]&d[0])=(~0&~1&~0)|(0&0)|(1&0)= (1&0&1)|(0&0)|(1&0)=0|0|0=0;
the eighth digit of data enc[7]=d[4]=0;
the ninth digit of data enc[8]=d[7]=1.

By the above encoding approach, it may be ensured that at least one of any 5 consecutive digits of 9-bit data is different from the other digits, that is, 5 consecutive 0s or 5 consecutive is will not appear in the 9-bit data.

At step 402, the first digit of data of the 9-bit data and a previous digit of data adjacent to the first digit of data are detected, when the to-be-encoded byte is not the first byte of the to-be-transmitted data.

Since the to-be-transmitted data may include multiple bytes, and the encoding approach may be different for situations in which the to-be-encoded byte is the first byte and is not the first byte, at the time of encoding, it may be possible to first detect whether the to-be-encoded byte is the first byte of the to-be-transmitted data, and if no, since the data is encoded in order, it shows that there exist at least one encoded byte in front of the to-be-encoded byte, that is, byte(s) for which the 8b/10b encoding has been done. For a byte for which the 8b/10b encoding has been done, actually, original 8-bit digits of data have been converted into 10-bit digits of data, and therefore an encoded byte corresponds to 10-bit data. For the to-be-encoded 9-bit data, it may be possible to detect the first digit of data of the 9-bit data and a previous digit of data adjacent to the first digit of data (that is, the last digit of previous 10-bit data) so as to compare whether they are the same, to conduct addition of a tenth digit of data which is used for indicating whether the 9-bit data has undergone an inversion operation. If they are the same, step 403 may be performed, and if they are different, step 404 may be performed.

At the step 403, the 9-bit data is inverted and then a tenth digit of data for indicating that the inverted 9-bit data has undergone an inversion operation is added behind the inverted 9-bit data to obtain 10-bit data, when the numerical value of the first digit of data is the same as that of the previous digit of data In an embodiment of the disclosure, adopting a tenth digit of data to indicate whether the 9-bit data has undergone an inversion operation may ensure that the receiving end can effectively decode the received data.

Exemplarily, assume that when the tenth digit of data is 1, it indicates that the 9-bit data has undergone an inversion operation, and when the tenth digit of data is 0, it indicates that the 9-bit data has not undergone an inversion operation. Then, when the numerical value of the first digit of data is the same as that of the previous digit of data (e.g., both the first digit of data and the previous digit of data are 0, or both the first digit of data and the previous digit of data are 1), the 9-bit data is inverted and then a tenth digit of data, i.e. 1, for indicating that the inverted 9-bit data has undergone an inversion operation is added behind the inverted 9-bit data to obtain 10-bit data.

Figure 4C:
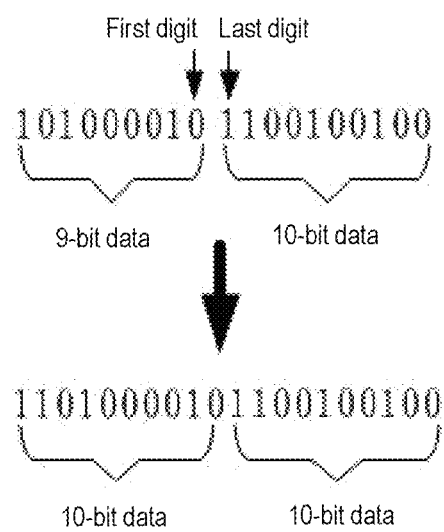
FIG. 4c is a schematic diagram of a 9b/10b encoding approach shown according to an exemplary embodiment.

Exemplarily, as shown in FIG. 4c, assume that the to-be-encoded 9-bit data is 100100010, and 10-bit data located ahead of and adjacent to the 9-bit data is 0101000100. Since the first digit of data of the 9-bit data is 0, the last digit of its previous 10-bit data is 0 (that is, a previous digit of data to the first digit of data is 0), and the two are the same, the 9-bit data is inverted to obtain 011011101, then a tenth digit of data 1 is added, and the finally obtained 10-bit data is 1011011101.

At the step 404, a tenth digit of data for indicating that the 9-bit data has not undergone an inversion operation is added behind the 9-bit data to obtain 10-bit data, when the numerical value of the first digit of data is different from that of the previous digit of data. Step 406 is performed.

Exemplarily, assume that when the tenth digit of data is 1, it indicates that the 9-bit data has undergone an inversion operation, and when the tenth digit of data is 0, it indicates that the 9-bit data has not undergone an inversion operation. Then, a procedure of adding a tenth digit of data for indicating that the 9-bit data has not undergone an inversion operation behind the 9-bit data to obtain 10-bit data when the numerical value of the first digit of data is different from that of the previous digit of data may specifically include: adding a tenth digit of data for indicating that the 9-bit data has not undergone an inversion operation and being 0 behind the 9-bit data to obtain 10-bit data when one of the first digit of data and the previous digit of data is 0 and the other is 1.

Figure 4D:
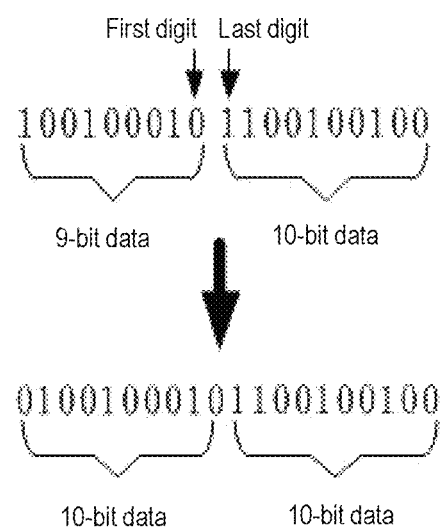
FIG. 4d is a schematic diagram of another 9b/10b encoding approach shown according to an exemplary embodiment.

Exemplarily, as shown in FIG. 4d, assume that the to-be-encoded 9-bit data is 100100010, and 10-bit data located ahead of and adjacent to the 9-bit data is 1100100100. Since the first digit of data of the 9-bit data is 0, the last digit of its previous 10-bit data is 1 (that is, a previous digit of data to the first digit of data is 1), and the two are different, a tenth digit of data 0 is added behind the 9-bit data, and the finally obtained 10-bit data is 0100100010.

The above steps 403 and 404 may ensure that a jumping edge exists between every two adjacent encoded bytes (that is, every two 10-bit data), and this facilitates the receiving end to clearly differentiate between every two adjacent encoded bytes and implement accurate decoding.

At the step 405, when the to-be-encoded byte is the first byte of the to-be-transmitted data, assume the previous digit of data to the first digit of data of the 9-bit data is 0, and the 9-bit data is processed according to the step 403 or the step 404, to obtain 10-bit data.

In embodiments of the disclosure, since the to-be-encoded byte is the first byte of the to-be-transmitted data, the previous digit of data to the first digit of data of the 9-bit data does not exist. It is assumed in the embodiment of the disclosure that the previous digit of data is 0, and in other embodiments, it may also be assumed that the previous digit of data to its first digit of data is 1, and then the steps 403 to 404 are performed.

In a practical application, when the to-be-encoded byte is the first byte of the to-be-transmitted data, it may further be possible to encode the 9-bit data into 10-bit data adopting other approaches, as long as it is ensured that the receiving end can effectively decode. For example, when the to-be-encoded byte is the first byte of the to-be-transmitted data, that is, a previous digit of data does not exist in front of its first digit of data, it may be assumed that a jumping edge exists between the first digit of data of the 9-bit data and the previous digit of data, and a tenth digit of data for indicating that the 9-bit data has not undergone an inversion operation is added behind the 9-bit data to obtain 10-bit data, of which a specific procedure may be referred to the step 404. It may further be assumed that a jumping edge does not exist between the first digit of data of the 9-bit data and the previous digit of data, and it may be possible to invert the 9-bit data and then add a tenth digit of data for indicating that the inverted 9-bit data has undergone an inversion operation is added behind the inverted 9-bit data to obtain 10-bit data, of which a specific procedure may be referred to the step 403.

At step 406, a first identification code is added at a preset position of the encoded to-be-transmitted data to obtain target data.

The encoded to-be-transmitted data includes 10-bit data obtained by encoding the 8-bit data corresponding to the to-be-encoded byte. In an embodiment, to ensure that the receiving end receives data in one unit per 10 bits, the sending end also needs to send data in one unit per 10 bits, and therefore, the first identification code needs to be 10-bit data and may be preset data, as long as it plays the role of identification.

In an embodiment of the disclosure, the 8b/9b encoding algorithm provided by the step 401 may ensure that at least one of any 5 consecutive digits of the 9-bit data is different from the other digits, and after the 9b/10b encoding algorithm of the steps 403-405, since a tenth digit of data is added, it may be ensured that at least one of any 6 consecutive digits of the 10-bit data is different from the other digits, that is, 6 consecutive 0s or 6 consecutive 1s will not appear in the 10-bit data obtained by the encoding.

Therefore, the first identification code may include at least 6 consecutive digits of identical data to be differentiated from normally transmitted 10-bit data. Exemplarily, the first identification code may include 6 consecutive 0s or 6 consecutive 1s. The first identification code is used for identifying transmitted content, start of transmission or end of transmission.

Exemplarily, the first identification code may be denoted as K, and its specific code value may be referred to table 1.

TABLE 1

| K1 | 0b0111111010 | 0b1000000101 |
| K2 | 0b0111111011 | 0b1000000100 |
| K3 | 0b0111111001 | 0b1000000110 |
| K4 | 0b0111111000 | 0b1000000111 |

Therein, 0b represents binary, each identification code in K1 to K4 corresponds to two representations, respectively, and its first digit of data (note that it means the first of the low digits on the right side) is determined according to a previous digit of data to guarantee forming a flip edge with the previous digit of data. For example, when the previous digit of data to the first digit of data of the K1 code is 0, then the K1 code is adopted of which the first digit of data is 1, that is, 1000000101, and when the previous digit of data to the first digit of data of the K1 code is 1, then the K1 code is adopted of which the first digit of data is 0, that is, 0111111010, which may thus guarantee effective recognition of the first identification code. Exemplarily, in table 1, K1 is used for indicating start of transmission, K2 is used for indicating cutoff of transmission, K3 is used for indicating a cutoff position of a row signal and may further be used for instructing a linear feedback register to perform a reset operation, and K4 is used for indicating end of transmission.

Figure 4E:
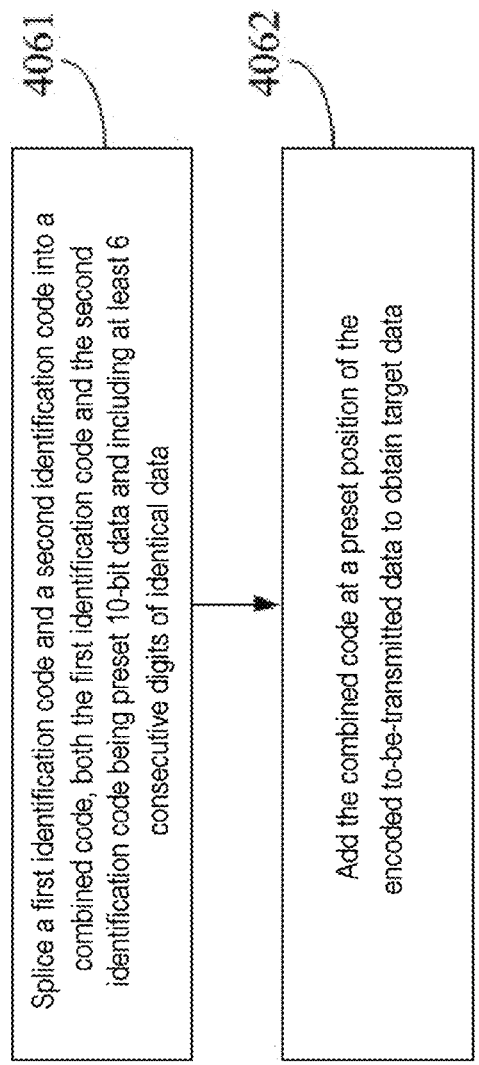
FIG. 4e is a flow chart of a method for adding a first identification code shown according to an exemplary embodiment.

For example, when the first identification code is used for indicating start of transmission, the first identification code may be directly added in front of the to-be-transmitted data, or may also be added in front of the to-be-transmitted data in the form of combined code. Exemplarily, as shown in FIG. 4e, when the first identification code is added in front of the to-be-transmitted data in the form of combined code, a procedure of adding the first identification code in front of the encoded to-be-transmitted data to obtain target data may include: step 4061, splicing the first identification code and a second identification code into a combined code, the second identification code being also preset 10-bit data, the second identification code also comprising at least 6 consecutive digits of identical data, and the second identification code being different from the first identification code.

In an embodiment of the disclosure, the combined code may include at least one first identification code and at least one second identification code, and the numerical value of a first identification code at a different position in the same combined code may be different. For example, the first identification codes in the combined code include different K1 in table 1. Similarly, the numerical value of a second identification code at a different position may be different. The sending end and the receiving end may pre-agree on an arrangement way of a combined code, and employ a form of a combined code table for record. In some embodiments, when there is at least one identification code in a combined code which is correctly transmitted, the receiving end may recover the correct combined code by querying the combined code table. For example, a first identification code is K1, a second identification code is G1, then a combined code may be K1G1G1K1, and when K1 is incorrectly transmitted, the receiving end may recover K1G1G1K1 by looking up the table according G1.

Exemplarily, the second identification code is denoted as G, and G may have 4 forms in total, G1, G2, G3 and G4, of which specific code values may be referred to table 2, wherein 0b represents binary.

TABLE 2

| G1 | 0b0101010111 | 0b1010101000 |
| G2 | 0b0100011111 | 0b1011100000 |
| G3 | 0b0110001111 | 0b1001110000 |
| G4 | 0b0111000111 | 0b1000111000 |

Exemplarily, assume that a combined code is obtained by combining a first identification code K and a second identification code G in the form of KGKG, and the combined code table may be referred to table 3. Assume that the received combined code is successively arranged 0111111010, 1010101000, 1000000101 and 1111111111. Employing the combined code to query the combined code table as shown in table 3, it may be found out that the first 3 10-bit data of the combined code is identical to the first 3 10-bit data in the combined code of the first row in table 3, and therefore, it may be determined that the correct combined code is successively arranged 0111111010, 1010101000, 1000000101 and 0101010111, and accordingly, the first identification code that may be extracted is K1.

TABLE 3

| Extractable first identification code | Combined code | | | |
| --- | --- | --- | --- | --- |
| | K | G | K | G |
| K1 | 0111111010 | 1010101000 | 1000000101 | 0101010111 |
| K2 | 0111111011 | 1011100000 | 1000000100 | 0100011111 |
| K3 | 0111111001 | 1001110000 | 1000000110 | 0110001111 |
| K4 | 0111111000 | 1000111000 | 1000000111 | 0111000111 |

At step 4062, the combined code is added at a preset position of the encoded to-be-transmitted data to obtain target data.

In an embodiment of the disclosure, the preset position is determined according to the content indicated by the first identification code. For example, when the first identification code indicates start of transmission, the preset position is a position in front of the to-be-transmitted data, that is, in front of the first digit of data of the first set of 10-bit data; when the first identification code indicates end of transmission, the preset position is a position behind the to-be-transmitted data, that is, behind the last digit of data of the last set of 10-bit data of the to-be-transmitted data; and when the first identification code is used for identifying transmitted content, the preset position may be between two specified sets of 10-bit data of the to-be-transmitted data.

At step 407, the target data is sent.

In an embodiment of the disclosure, when the sending end of data is a timing controller, the receiving end of data may be a source driver chip, and when the sending end of data is a source driver chip, the receiving end of data may be a timing controller. Exemplarily, the timing controller may send the target data to a corresponding source driver chip via a first signal line (e.g., a high speed differential signal line) or the second signal line, which will not be limited by the embodiment of the disclosure.

It is noted that, the order of the steps of the encoding method provided by the embodiment of the disclosure may be appropriately adjusted, and the steps may also be increased or decreased accordingly according to the situation. Variations of the method easily occurring to any skilled person familiar with the technical field within the technical scope disclosed by the disclosure should all be encompassed within the protective scope of the invention, and therefore will not be repeated any longer.

For the encoding method provided by an embodiment of the disclosure, at the time of data encoding, 8-bit data is encoded into 9-bit data first, and then a tenth digit is added to obtain 10-bit data; and a jumping edge is arranged between every two adjacent 10-bit data, and the tenth digit of data is used for indicating whether the 9-bit data has undergone an inversion operation, which can effectively ensure that the to-be-transmitted data can be correctly recovered at a receiving end, and the jumping edge may effectively reduce transmission errors.

It is noted that, in the current field of timing control, there are usually two approaches for signal transmission, PLL and DLL, wherein the PLL is more common, and the DLL requires that a jumping edge needs to occur in a transmission procedure. However, since it can be ensured that a jumping edge occurs between two adjacent encoded bytes (that is, two adjacent sets of 10-bit data), the above described encoding method may effectively reduce the probability of incorrect transmission, and meet the requirements of the PLL and the DLL, such that the receiving end can support the signal transmission approaches of the PLL and the DLL simultaneously.

In a practical application, the less the consecutive and identical data in the transmitted data, the better the jitter performance is. Since the 8b/9b encoding algorithm provided by the step 401 may ensure that at least one of any 5 consecutive digits of the 9-bit data is different from the other digits, after the 9b/10b encoding algorithm of the steps 403 to 405, it may be ensured that at least one of any 6 consecutive digits of the 10-bit data is different from the other digits, and therefore, it may be ensured that the encoded data will have a good jitter performance in a subsequent transmission procedure.

Figure 5A:
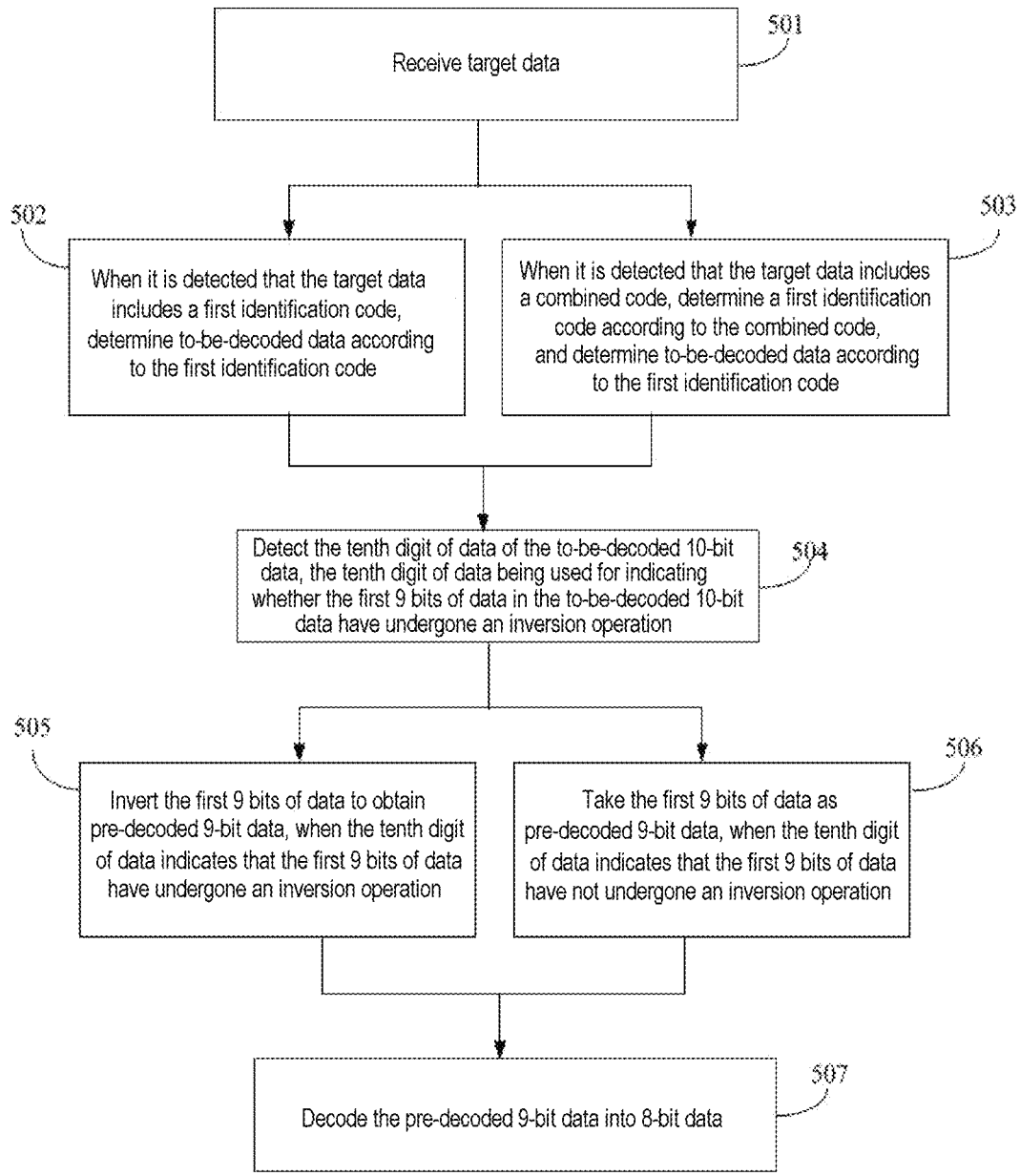
FIG. 5a is a flow diagram of another decoding method shown according to an exemplary embodiment.

An embodiment of the disclosure provides a decoding method which corresponds to the encoding method provided by the embodiment of the disclosure. As shown in FIG. 5a, the method may be applied in the environment as shown in FIG. 1, and the method includes the following steps.

At step 501, target data is received.

The target data includes at least one set of 10-bit data, which is binary data. In an embodiment, the target data generally includes at least two sets of 10-bit data, wherein a first identification code may be included, and the first identification code may identify transmitted content, start of transmission or end of transmission, to facilitate better recognition of to-be-decoded data.

In an embodiment of the disclosure, when the sending end of data is a timing controller, the receiving end of data may be a source driver chip, and when the sending end of data is a source driver chip, the receiving end of data may be a timing controller. Exemplarily, the source driver chip may send the target data to a corresponding timing controller via a first signal line (e.g., a high speed differential signal line) or the second signal line, which will not be limited by embodiments of the disclosure.

At step 503, when it is detected that the target data includes a combined code, a first identification code is determined according to the combined code, and to-be-decoded data is determined according to the first identification code.

In an embodiment of the disclosure, the combined code is obtained by splicing the first identification code and a second identification code; the first identification code is preset 10-bit data, and the first identification code includes at least 6 consecutive digits of identical data; the second identification code is also preset 10-bit data, and the second identification code also includes at least 6 consecutive digits of identical data; and the second identification code is different from the first identification code.

The combined code may include at least one first identification code and at least one second identification code, and the numerical value of a first identification code at a different position in the same combined code may be different. For example, the first identification codes in the combined code include different K1 in table 1. Similarly, the numerical value of a second identification code at a different position may be different. The sending end and the receiving end may pre-agree on an arrangement way of a combined code, and employ a form of a combined code table for record. In some embodiments, when there is at least one identification code in a combined code which is correctly transmitted, the receiving end may recover the correct combined code by querying the combined code table.

When it is detected that the target data includes a combined code, the receiving end may determine a first identification code according to the combined code, and then determine to-be-decoded data according to the first identification code. In particular, the receiving end may query a combined code table according to the combined code, and when there is at least one identification code in the combined code which may be queried in the combined code table, which shows there is at least one identification code transmitted correctly in the combined code, the correct combined code may be recovered by querying the table, and then a first identification code is extracted from a preset position of the combined code, to determine to-be-decoded data.

It is noted that, when any of the identification codes in the combined code cannot be queried in the combined code table, it shows that the combined code is incorrect and the corresponding to-be-decoded data is also transmitted incorrectly, which may not be processed subsequently.

Since the first identification is used for identifying transmitted content, start of transmission or end of transmission, the position of a specific first identification code in the target data is determined according to the first identification code, and then the to-be-decoded data is determined according to the first identification code and its position.

In an embodiment of the disclosure, the first identification code is carried in the form of a combined code, which may improve the accuracy of decoding the first identification code.

At step 502, when it is detected that the target data includes a first identification code, to-be-decoded data is determined according to the first identification code.

The to-be-decoded data includes at least one set of to-be-decoded 10-bit data, the first identification code is preset 10-bit data, and the first identification code includes at least 6 consecutive digits of identical data.

Since a first identification code is used for identifying transmitted content, start of transmission or end of transmission, it may be possible to determine the position of a specific first identification code in the target data according to the first identification code, and then determine the to-be-decoded data according to the first identification code and its position. Here, reference may be made to the relevant content at the step 502.

At step 504, the tenth digit of data of the to-be-decoded 10-bit data is detected, the tenth digit of data being used for indicating whether the first 9 bits of data in the to-be-decoded 10-bit data have undergone an inversion operation.

At step 505, the first 9 bits of data are inverted to obtain pre-decoded 9-bit data, when the tenth digit of data indicates that the first 9 bits of data have undergone an inversion operation.

Exemplarily, assume that when the tenth digit of data is 1, it may indicate that the 9 bits of data have undergone an inversion operation, and when the tenth digit of data is 0, it may indicate that the 9 bits of data have not undergone an inversion operation. Assume that the to-be-decoded 10-bit data is 1011011101. Its tenth digit of data is 1, showing that the first 9 bits of data 011011101 have undergone an inversion operation, and the first 9 bits of data 011011101 are inverted to obtain pre-decoded 9-bit data 100100010.

At step 506, the first 9 bits of data are taken as pre-decoded 9-bit data, when the tenth digit of data indicates that the first 9 bits of data have not undergone an inversion operation.

Exemplarily, assume that when the tenth digit of data is 1, it may indicate that the 9 bits of data have undergone an inversion operation, and when the tenth digit of data is 0, it may indicate that the 9 bits of data have not undergone an inversion operation. Assume that the to-be-decoded 10-bit data is 0011011101. Its tenth digit of data is 0, showing that the first 9 bits of data 011011101 have not undergone an inversion operation, and the first 9 bits of data 011011101 are taken as pre-decoded 9-bit data 011011101.

At step 507, the pre-decoded 9-bit data is decoded into 8-bit data.

At least one of any 5 consecutive digits of the pre-decoded 9-bit data is different from the other digits, that is, 5 consecutive 0s or 5 consecutive 1s will not appear in the 9-bit data. Decoding the pre-decoded 9-bit data into 8-bit data includes decoding the pre-decoded 9-bit data into the 8-bit data as follows:

Dout[7]=d_code[8];
Dout[6]=d_code[4];
Dout[5]=d_code[3];
Dout[4]=d_code[7];

Dout[3]=d_code[0];
Dout[2]=(d_code[6]^d_code[5])&~(~d_code[2]&d_code[1]);
Dout[1]=(d_code[6]^d_code[5])&~(d_code[2]&~d_code[1]);
Dout[0]=(d_code[6]&~d_code[5])|(d_code[6]&d_code[5]&d_code[2])|(~d_code[6]&~d_code[5]&d_code[2]);

wherein d_code[i] is the (i+1)-th digit in the 9-bit data, 8≥i≥0, and i is an integer; Dout[j] is the (j+1)-th digit in the 8-bit data, 7≥j≥0, and j is an integer; and ^ represents performing an exclusive OR operation, ~ represents performing an inversion operation, & represents performing an AND operation, and | represents performing an OR operation. Therein, explanation of the inversion operation, the AND operation and the OR operation may be referred to the description with respect to the step 401, the exclusive OR operation represents two binary digits XOR each other, and its rule is that it is true as long as the former and the latter are different, wherein true is 1, false is 0, and then 1^1=0, 1^=1, 0^1=1, 1^1=0.

Figure 5B:
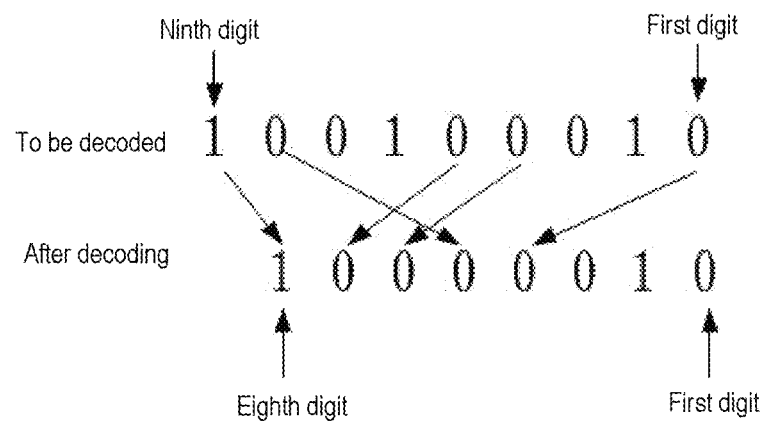
FIG. 5b is a schematic diagram of a 9b/8b decoding approach shown according to an exemplary embodiment.

Exemplarily, as shown in FIG. 5b, assume that the pre-decoded 9-bit data is 100100010, and its first digit of data to the ninth digit of data are successively 0, 1, 0, 0, 0, 1, 0, 0, 1. Then, it may be decoded into 8-bit data 10000010 according to the above decoding approach, wherein in the 8-bit data, the eighth digit of data Dout[7]=d_code[8]=1;
the seventh digit of data Dout[6]=d_code[4]=0;
the sixth digit of data Dout[5]=d_code[3]=0;
the fifth digit of data Dout[4]=d_code[7]=0;
the fourth digit of data Dout[3]=d_code[0]=0;
the third digit of data Dout[2]=(d_code[6]^d_code[5])&~(~d_code[2]&d_code[1])=(0^1)&~(~0&1)=1&~(1&1)=1&~1=1&0=0;
the second digit of data Dout[1]=(d_code[6]^d_code[5])&~(d_code[2]&~d_code[1])=(0^1)&~(0&~1)=1&~(0&0)=1&~0=1&1=1;
the first digit of data Dout[0]=(d_code[6]&~d_code[5])|(d_code[6]& d_code[5]&d_code[2])|(~d_code[6]&~d_code[5]&d_code[2])=(0&~1)|(0&1&0)|(~0&~1&0)=(0&0)|(0&1&0)|(1&0&0)=0|0|0=0.

For explanation of the first identification code, the second identification code, the combined identification code and other relevant features, reference may further be made to the description in connection with FIG. 4a to FIG. 4e.

It is noted that, the order of the steps of the decoding method provided by the individual embodiments of the disclosure may be appropriately adjusted, and the steps may also be increased or decreased accordingly according to the situation. Variations of the method easily occurring to any skilled person familiar with the technical field within the technical scope disclosed by the disclosure should all be encompassed within the protective scope of the invention, and therefore will not be repeated any longer.

For the decoding method provided by the individual embodiments of the disclosure, at the time of data decoding, the 10-bit data is decoded into 9-bit data according to the tenth digit of data first, and then the 9-bit data is decoded into 8-bit data, which can effectively ensure that the transmitted data can be correctly recovered at a receiving end, and the jumping edge may effectively reduce transmission errors.

It is worth noting that since it can be ensured that a jumping edge occurs between two adjacent encoded bytes (that is, two adjacent sets of 10-bit data), the above described decoding method may effectively reduce the probability of incorrect transmission, such that the receiving end can support the signal transmission approaches of the PLL and the DLL simultaneously by the above decoding approach.

Figure 6A:
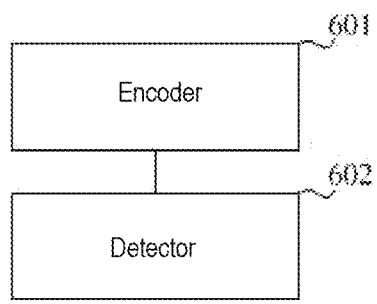
FIG. 6a is a structural schematic diagram of an encoding device shown according to an exemplary embodiment.

An embodiment of the disclosure provides an encoding device, as shown in FIG. 6a, comprising: an encoder 601 for performing the step 401 in FIG. 4a, namely, encoding 8-bit data corresponding to a to-be-encoded byte of to-be-transmitted data into 9-bit data, the to-be-transmitted data comprising at least one to-be-encoded byte; a detector 602 for performing the step 402 in FIG. 4a, namely, detecting the first digit of data of the 9-bit data and a previous digit of data adjacent to the first digit of data, when the to-be-encoded byte is not the first byte of the to-be-transmitted data; the encoder 601 being further used for performing the steps 403 and 404 in FIG. 4a, namely, inverting the 9-bit data and then adding a tenth digit of data for indicating that the inverted 9-bit data has undergone an inversion operation behind the inverted 9-bit data to obtain 10-bit data, when the numerical value of the first digit of data is the same as that of the previous digit of data; and adding a tenth digit of data for indicating that the 9-bit data has not undergone an inversion operation behind the 9-bit data to obtain 10-bit data, when the numerical value of the first digit of data is different from that of the previous digit of data; wherein all the said data is binary data.

For the encoding device provided by the one embodiment of the disclosure, when performing data encoding, the encoder encodes 8-bit data into 9-bit data first, then adds a tenth digit to obtain 10-bit data, and arranges a jumping edge between every two adjacent 10-bit data, and the tenth digit of data is used for indicating whether the 9-bit data has undergone an inversion operation, which can effectively ensure that the to-be-transmitted data can be correctly recovered at a receiving end, and the jumping edge may effectively reduce transmission errors.

In an embodiment of the disclosure, at least one of any 5 consecutive digits of the 9-bit data is different from the other digits, and the encoder 601 is specifically used for encoding the 8-bit data into the 9-bit data as follows:

enc[0]=d[3];
enc[1]=(~d[2]&d[1])|(d[2]&d[1]&~d[3])|(~d[2]&~d[0]);
enc[2]=(d[2]&~d[1])|(d[2]&d[1]&~d[3])|(~d[1]&d[0]);
enc[3]=d[5];
enc[4]=d[6];
enc[5]=(~d[2]&~d[1]&~d[4])|(d[2]&~d[0])|(d[1]&~d[0]);
enc[6]=(~d[2]&~d[1]&~d[4])|(d[2]&d[0])|(d[1]&d[0]);
enc[7]=d[4];
enc[8]=d[7];

wherein enc[i] is the (i+1)-th digit in the 9-bit data, 8≥i≥0, and i is an integer; d[j] is the (j+1)-th digit in the 8-bit data, 7≥j≥0, and j is an integer; and ~ represents performing an inversion operation, & represents performing an AND operation, and | represents performing an OR operation.

In an embodiment, when the tenth digit of data is 1, it indicates that the 9-bit data has undergone an inversion operation, and when the tenth digit of data is 0, it indicates that the 9-bit data has not undergone an inversion operation.

Accordingly, the encoder 601 is specifically used for, inverting the 9-bit data and then adding a tenth digit of data for indicating that the inverted 9-bit data has undergone an inversion operation and being 1 behind the inverted 9-bit data to obtain 10-bit data, when both the first digit of data and the previous digit of data are 0 or both the first digit of data and the previous digit of data are 1; and adding a tenth digit of data for indicating that the 9-bit data has not undergone an inversion operation and being 0 behind the 9-bit data to obtain 10-bit data, when one of the first digit of data and the previous digit of data is 0 and the other is 1.

In an embodiment of the disclosure, the encoder 601 is further used for implementing the step 405 in FIG. 4b and in turn proceeding to the step 403 or 404, namely, detecting whether the first digit of data of the 9-bit data is 0 when the to-be-encoded byte is the first byte of the to-be-transmitted data; inverting the 9-bit data and then adding a tenth digit of data for indicating that the inverted 9-bit data has undergone an inversion operation behind the inverted 9-bit data to obtain 10-bit data, when the first digit of data is 0; and adding a tenth digit of data for indicating that the 9-bit data has not undergone an inversion operation behind the 9-bit data to obtain 10-bit data, when the first digit of data is not 0.

Figure 6B:
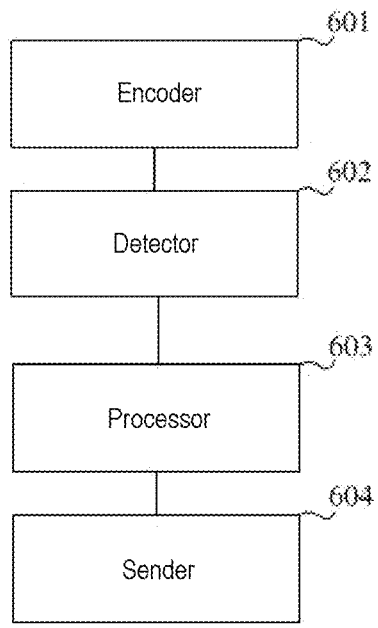
FIG. 6b is a structural schematic diagram of another encoding device shown according to an exemplary embodiment.

Further, as shown in FIG. 6b, the device further includes: a processor 603 for performing the step 406 in FIG. 4a, namely, adding a first identification code at a preset position of the encoded to-be-transmitted data to obtain target data, the first identification code being preset 10-bit data, the first identification code comprising at least 6 consecutive digits of identical data, the first identification code being used for identifying transmitted content, start of transmission or end of transmission, and the encoded to-be-transmitted data comprising the 10-bit data obtained by encoding the 8-bit data corresponding to the to-be-encoded byte; and a sender 604 for sending the target data.

In an embodiment of the disclosure, the processor 603 is specifically used for performing the step 4061 in FIG. 4e, namely, splicing the first identification code and a second identification code into a combined code, the second identification code being also preset 10-bit data, the second identification code also comprising at least 6 consecutive digits of identical data, and the second identification code being different from the first identification code; and the step 4062, namely, adding the combined code at a preset position of the encoded to-be-transmitted data to obtain the target data.

For explanation of the first identification code, the second identification code, the combined identification code and other relevant features, reference may further be made to the description in connection with FIG. 4a to FIG. 4e.

For the encoding device provided by the individual embodiments of the disclosure, when performing data encoding, the encoder encodes 8-bit data into 9-bit data first, then adding a tenth digit to obtain 10-bit data, and arranging a jumping edge between every two adjacent 10-bit data, and the tenth digit of data is used for indicating whether the 9-bit data has undergone an inversion operation, which can effectively ensure that the to-be-transmitted data can be correctly recovered at a receiving end, and the jumping edge may effectively reduce transmission errors.

Figure 7A:
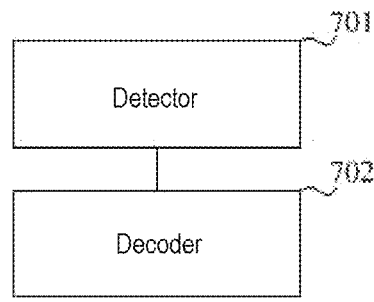
FIG. 7a is a structural schematic diagram of a decoding device shown according to an exemplary embodiment.

An embodiment of the disclosure provides a decoding device corresponding to the encoding device as shown in FIG. 6a, as shown in FIG. 7a, comprising: a detector 701 for performing the step 504 in FIG. 5a, namely, detecting the tenth digit of data of to-be-decoded 10-bit data, the tenth digit of data being used for indicating whether the first 9 bits of data in the to-be-decoded 10-bit data have undergone an inversion operation; and a decoder 702 for performing the steps 505 or 506 and 508 in FIG. 5a, namely, inverting the first 9 bits of data to obtain pre-decoded 9-bit data, when the tenth digit of data indicates that the first 9 bits of data have undergone an inversion operation; taking the first 9 bits of data as pre-decoded 9-bit data, when the tenth digit of data indicates that the first 9 bits of data have not undergone an inversion operation; and decoding the pre-decoded 9-bit data into 8-bit data; wherein all the said data is binary data.

For the decoding device provided by the embodiment of the disclosure, when performing data decoding, the decoder decodes the 10-bit data into 9-bit data according to the tenth digit of data first, and then decodes the 9-bit data into 8-bit data, which can effectively ensure that the transmitted data can be correctly recovered at a receiving end, and the jumping edge may effectively reduce transmission errors.

In an embodiment of the disclosure, at least one of any 5 consecutive digits of the pre-decoded 9-bit data is different from the other digits, and the decoder 702 is specifically used for decoding the pre-decoded 9-bit data into the 8-bit data as follows:

Dout[7]=d_code[8];
Dout[6]=d_code[4];
Dout[5]=d_code[3];
Dout[4]=d_code[7];
Dout[3]=d_code[0];
Dout[2]=(d_code[6]^d_code[5])&~(~d_code[2]&d_code[1]);
Dout[1]=(d_code[6]^d_code[5])&~(d_code[2]&~d_code[1]);
Dout[0]=(d_code[6]&~d_code[5])|(d_code[6]&d_code[5]&d_code[2])|(~d_code[6]&~d_code[5]&d_code[2]);

wherein d_code[i] is the (i+1)-th digit in the pre-decoded 9-bit data, 8≥i≥0, and i is an integer; Dout[j] is the (j+1)-th digit in the 8-bit data, 7≥j≥0, and j is an integer; and ^ represents performing an exclusive OR operation, ~ represents performing an inversion operation, & represents performing an AND operation, and | represents performing an OR operation.

In an embodiment of the disclosure, when the tenth digit of data is 1, it indicates that the 9-bit data has undergone an inversion operation, and when the tenth digit of data is 0, it indicates that the 9-bit data has not undergone an inversion operation.

Figure 7B:
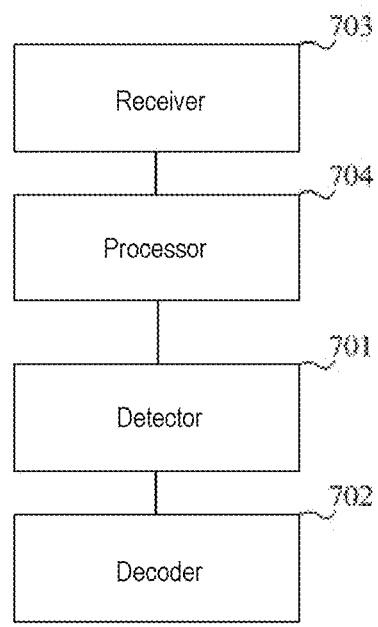
FIG. 7b is a structural schematic diagram of another decoding device shown according to an exemplary embodiment.

Further, as shown in FIG. 7b, the device further includes: a receiver 703 for receiving target data; and a processor 704 for performing the step 502 in FIG. 5a, namely, determining to-be-decoded data according to a first identification code when it is detected that the target data includes the first identification code, the to-be-decoded data comprising at least one set of to-be-decoded 10-bit data, the first identification code being preset 10-bit data, the first identification code comprising at least 6 consecutive digits of identical data, and the first identification code being used for identifying transmitted content, start of transmission or end of transmission.

In an embodiment of the disclosure, the processor 704 is further used for performing the step 503 in FIG. 5a, namely, determining a first identification code according to a combined code when it is detected that the target data includes the combined code, and determining to-be-decoded data according to the first identification code;

wherein the combined code is obtained by splicing the first identification code and a second identification code, the second identification code is also preset 10-bit data, the second identification code also includes at least 6 consecutive digits of identical data, and the second identification code is different from the first identification code.

For explanation of the first identification code, the second identification code, the combined identification code and other relevant features, reference may further be made to the description in connection with FIG. 4a to FIG. 4e.

For the decoding device provided by the individual embodiments of the disclosure, when performing data decoding, the decoder decodes the 10-bit data into 9-bit data according to the tenth digit of data first, and then decodes the 9-bit data into 8-bit data, which can effectively ensure that the transmitted data can be correctly recovered at a receiving end, and the jumping edge may effectively reduce transmission errors.

Figure 8:
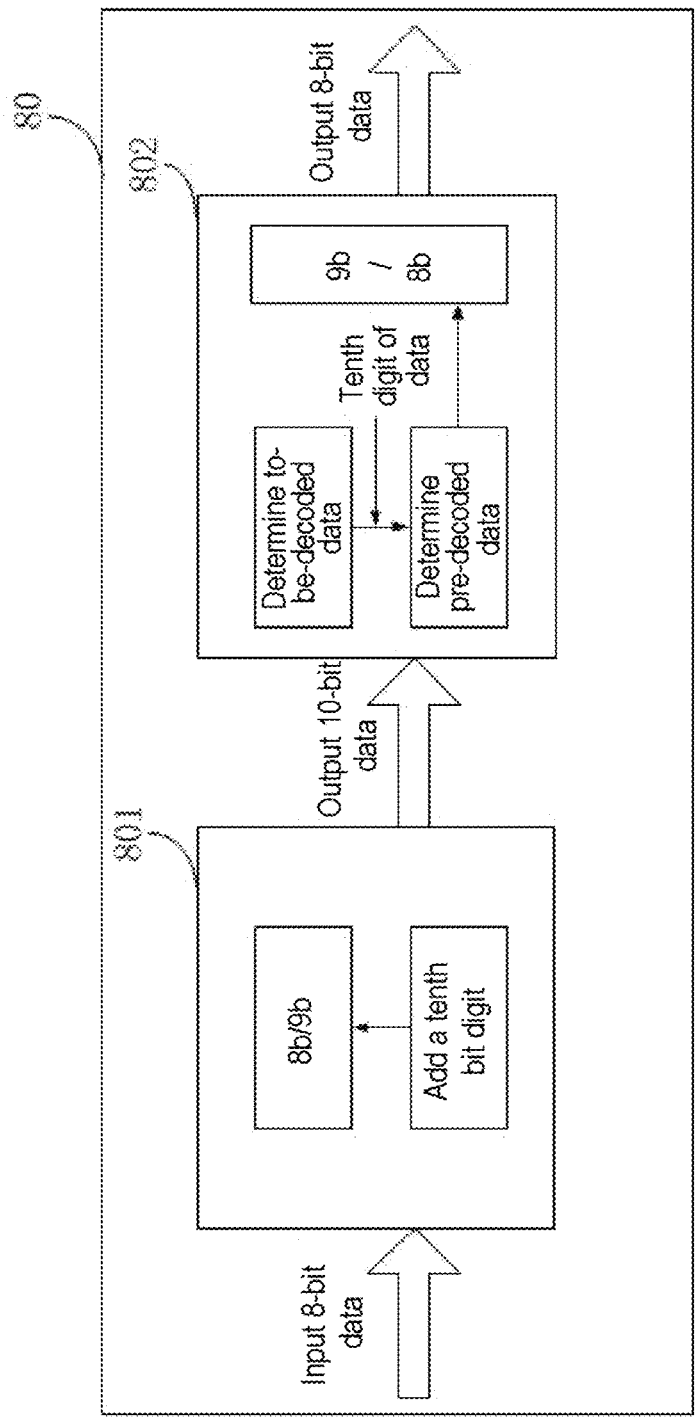
FIG. 8 is a structural schematic diagram of a signal transmission system shown according to an exemplary embodiment.

As shown in FIG. 8, an embodiment of the disclosure provides a signal transmission system 80 comprising a timing controller and a source driver chip. A structure of the signal transmission system may be referred to FIG. 1, wherein the timing controller may include an encoding device 801 which may be an encoding device as shown in FIG. 6a or FIG. 6b, and the source driver chip may include a decoding device 802 which may be a decoding device as shown in FIG. 7a or FIG. 7b.

Or, an embodiment of the invention provides a signal transmission system 80 comprising a timing controller and a source driver chip. A structure of the signal transmission system may be referred to FIG. 1, wherein the timing controller may include a decoding device 802 which may be a decoding device as shown in FIG. 7a or FIG. 7b, and the source driver chip may include an encoding device 801 which may be an encoding device as shown in FIG. 6a or FIG. 6b.

With reference to FIG. 8, the encoding device 801 may perform 8b/10b encoding, and the decoding device 802 may perform 10b/8b decoding. For example, when 8-bit data is inputted to the encoding device 801, the encoding device 801 first performs 8b/9b processing to output 9-bit data, then adds a tenth bit digit for indicating whether preceding 9-bit data has undergone inversion processing, and finally outputs 10-bit data; and after receive a first identification code, the decoding device 802 determines to-be-decoded data according to the first identification code, then determines a tenth digit of data in the to-be-decoded data, determines pre-decoded 9-bit data according to the tenth digit of data, and then performs 9b/8b processing to output 8-bit data. The encoding and decoding procedure may be referred to the embodiments of the methods as described above, which will not be repeated by an embodiment of the disclosure.

The signal transmission system may be applied in a display device, which may be any product or component with the display function, such as a liquid crystal panel, an electronic paper, an organic light emitting diode (OLED for short) panel, a mobile phone, a tablet computer, a television, a display, a notebook computer, a digital photo frame, a navigator, etc.

In the signal transmission system provided by the embodiment of the disclosure, for the encoding and decoding method used by it, at the time of data encoding, 8-bit data is encoded into 9-bit data first, then a tenth digit is added to obtain 10-bit data, a jumping edge is arranged between every two adjacent 10-bit data, and the tenth digit of data is used for indicating whether the 9-bit data has undergone an inversion operation, which can effectively ensure that the to-be-transmitted data can be correctly recovered at a receiving end, and the jumping edge may effectively reduce transmission errors; and at the time of data decoding, the 10-bit data is decoded into 9-bit data according to the tenth digit of data first, and then the 9-bit data is decoded into 8-bit data, which can effectively ensure that the transmitted data can be correctly recovered at a receiving end, and the jumping edge may effectively reduce transmission errors; and the logic of the encoding and decoding is simple, fewer resources are occupied, and the achievability is high.

For the devices and system in the above embodiments, specific approaches for performing operations by their respective components have been described in detail in relevant method embodiments, which will not be elucidated here. Moreover, in the individual embodiments of the disclosure, "/" may represent conversion, for example, 8b/10b represents converting 8-bit data into 10-bit data.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" or similar ones as used herein generally represent software, firmware, hardware, or a combination thereof. The features of the techniques described herein are platform-independent, meaning that the techniques may be implemented on a variety of computing platforms having a variety of processors.

Other implementation schemes of this application will easily occur to the person having skills in the art after considering the specification and practicing the disclosure disclosed herein. This application aims at covering any variations, uses or adaptations of this application, and these variations, uses or adaptations follow the general principles of this application and include common sense or common technical means in the art which is not disclosed by this application. The specification and the embodiments are simply deemed as exemplary, and the true scope and spirit of this application are pointed out by the claims.

It should be understood that, this application is not limited to the precise structures described above and shown in the drawings, and various modifications and changes may be made without departing from its scope. The scope of this application is only limited by the appended claims.

What is claimed is:

1. An encoding method; comprising:
   encoding 8-bit data corresponding to a to-be-encoded byte of to-be-transmitted data into 9-bit data, the to-be-transmitted data comprising at least one to-be-encoded byte;
   detecting a first digit of data of the 9-bit data and a previous digit of data adjacent to the first digit of data if the to-be-encoded byte is not a first byte of the to-be-transmitted data;
   inverting the 9-bit data and then adding a tenth digit of data for indicating that the inverted 9-bit data has undergone an inversion operation behind the inverted 9-bit data to obtain 10-bit data if a numerical value of the first digit of data is the same as that of the previous digit of data; and
   adding a tenth digit of data for indicating that the 9-bit data has not undergone an inversion operation behind the 9-bit data to obtain 10-bit data if the numerical value of the first digit of data is different from that of the previous digit of data,
   wherein all of the 8-bit data, the 9-bit data and the 10-bit data are binary data.

2. The method as claimed in claim 1, wherein
   the encoding the 8-bit data corresponding to the to-be-encoded byte of the to-be-transmitted data into the 9-bit data comprises:
   encoding the 8-bit data into the 9-bit data as follows, such that at least one of any 5 consecutive digits of the 9-bit data is different from the other digits:
   enc[0]=d[3];
   enc[1]=(~d[2]&d[1])|(d[2]&d[1]&~d[3])|(~d[2]&~d[0]);
   enc[2]=(d[2]&~d[1])|(d[2]&d[1]&~d[3])|(~d[1]&d[0]);
   enc[3]=d[5];

enc[4]=d[6];
enc[5]=(~d[2]&~d[1]&~d[4])(d[2]&~d[0])(d[1]&~d[0]);
enc[6]=(~d[2]&~d[1]&~d[4])|(d[2]&d[0])|(d[1]&d[0]);
enc[7]=d[4];
enc[8]=d[7];
wherein enc[i] is the (i+)-th digit in the 9-bit data, 8≥i≥0, and i is an integer; d[j] is the (j+1)-th digit in the 8-bit data, 7≥j≥0, and j is an integer; ~ represents performing an inversion operation, & represents performing an AND operation, and | represents performing an OR operation.

3. The method as claimed in claim 1,
wherein when the tenth digit of data is 1, it indicates that the 9-bit data has undergone the inversion operation, and when the tenth digit of data is 0, it indicates that the 9-bit data has not undergone the inversion operation, and
wherein after the encoding the 8-bit data corresponding to the to-be-encoded byte into the 9-bit data, the method further comprising:
detecting whether the first digit of data of the 9-bit data is 0 when the to-be-encoded byte is the first byte of the to-be-transmitted data;
inverting the 9-bit data and then adding the tenth digit of data for indicating that the inverted 9-bit data has undergone the inversion operation behind the inverted 9-bit data to obtain the 10-bit data if the first digit of data is 0; and
adding the tenth digit of data for indicating that the 9-bit data has not undergone the inversion operation behind the 9-bit data to obtain the 10-bit data if the first digit of data is not 0.

4. The method as claimed in claim 1,
wherein when the tenth digit of data is 1, it indicates that the 9-bit data has undergone the inversion operation, and when the tenth digit of data is 0, it indicates that the 9-bit data has not undergone the inversion operation, and
wherein the method further comprises:
adding a first identification code at a preset position of the encoded to-be-transmitted data to obtain target data, the first identification code being preset 10-bit data, the first identification code comprising at least 6 consecutive digits of identical data, the first identification code being used for identifying transmitted content, start of transmission or end of transmission, and the encoded to-be-transmitted data comprising the 10-bit data obtained by encoding the 8-bit data corresponding to the to-be-encoded byte; and
sending the target data.

5. The method as claimed in claim 1, wherein the method further comprises:
combining a first identification code and a second identification code into a combined code, both the first identification code and the second identification code being preset 10-bit data and comprising at least 6 consecutive digits of identical data, and the second identification code being different from the first identification code;
adding the combined code at a preset position of the encoded to-be-transmitted data to obtain target data; and
sending the target data.

6. A decoding method comprising:
detecting a tenth digit of data of to-be-decoded 10-bit data, the tenth digit of data being used for indicating whether a first 9 bits of data in the to-be-decoded 10-bit data has undergone an inversion operation;
inverting the first 9 bits of data to obtain pre-decoded 9-bit data if the tenth digit of data indicates that the first 9 bits of data have undergone the inversion operation;
taking the first 9 bits of data as the pre-decoded 9-bit data if the tenth digit of data indicates that the first 9 bits of data have not undergone an inversion operation; and
decoding the pre-decoded 9-bit data into 8-bit data,
wherein all of the 8-bit data, the 9-bit data and the 10-bit data are binary data.

7. The method as claimed in claim 6, wherein
at least one of any 5 consecutive digits of the pre-decoded 9-bit data is different from the other digits, and the decoding the pre-decoded 9-bit data into the 8-bit data comprises:
decoding the pre-decoded 9-bit data into the 8-bit data as follows:
Dout[7]=d_code[8];
Dout[6]=d_code[4];
Dout[5]=d_code[3];
Dout[4]=d_code[7];
Dout[3]=d_code[0];
Dout[2]=(d_code[6]^d_code[5])&~(~d_code[2]&d_code[1]);
Dout[1]=(d_code[6]^d_code[5])&~(d_code[2]&~d_code[1]);
Dout[0]=(d_code[6]&~d_code[5])|(d_code[6]&d_code[5]&d_code[2])|(~d_code[6]&~d_code[5]&d_code[2]);
wherein d_code[i] is the (i+)-th digit in the 9-bit data, 8≥i≥0, and i is an integer; Dout[j] is the (j+1)-th digit in the 8-bit data, 7≥j≥0, and j is an integer; and ^ represents performing an exclusive OR operation, ~ represents performing an inversion operation, & represents performing an AND operation, and | represents performing an OR operation.

8. The method as claimed in claim 6,
wherein when the tenth digit of data is 1, it indicates that the 9-bit data has undergone the inversion operation, and when the tenth digit of data is 0, it indicates that the 9-bit data has not undergone the inversion operation, and
wherein before the detecting the tenth digit of data of the to-be-decoded 10-bit data, the method further comprises:
receiving target data; and
determining to-be-decoded data according to an identification code when it is detected that the target data comprises the identification code, the to-be-decoded data comprising at least one set of to-be-decoded 10-bit data, the identification code being preset 10-bit data, the identification code comprising at least 6 consecutive digits of identical data, and the identification code being used for identifying transmitted content, start of transmission or end of transmission.

9. The method as claimed in claim 6,
wherein when the tenth digit of data is 1, it indicates that the 9-bit data has undergone the inversion operation, and when the tenth digit of data is 0, it indicates that the 9-bit data has not undergone the inversion operation, and
wherein before the detecting the tenth digit of data of the to-be-decoded 10-bit data, the method further comprises:
receiving target data; and determining a first identification code according to a combined code when it is detected that the target data comprises the combined code, and determining the to-be-decoded data according to the first identification code, wherein the combined code is obtained by combining the first identification code and a second identification code, the first identification code and the second identification code are preset 10-bit data and both comprise at least 6 consecutive digits of identical data, and the second identification code is different from the first identification code.

10. An encoding device comprising:

an encoder for encoding 8-bit data corresponding to a to-be-encoded byte of to-be-transmitted data into 9-bit data, the to-be-transmitted data comprising at least one to-be-encoded byte; and a detector for detecting a first digit of data of the 9-bit data and a previous digit of data adjacent to the first digit of data if the to-be-encoded byte is not a first byte of the to-be-transmitted data;

the encoder configured for:

inverting the 9-bit data and then adding a tenth digit of data for indicating that the inverted 9-bit data has undergone an inversion operation behind the inverted 9-bit data to obtain 10-bit data if a numerical value of the first digit of data is the same as that of the previous digit of data; and adding a tenth digit of data for indicating that the 9-bit data has not undergone an inversion operation behind the 9-bit data to obtain 10-bit data if the numerical value of the first digit of data is different from that of the previous digit of data;

wherein all of the 8-bit data, the 9-bit data and the 10-bit data are binary data.

11. The device as claimed in claim 10, wherein the encoder is specifically configured for:

encoding the 8-bit data into the 9-bit data as follows, such that at least one of any 5 consecutive digits of the 9-bit data is different from the other digits:

enc[0]=d[3];
enc[1]=(~d[2]&d[1])|(d[2]&d[1]&~d[3])|(~d[2]&~d[0]);
enc[2]=(d[2]&~d[1])|(d[2]&d[1]&~d[3])|(~d[1]&d[0]);
enc[3]=d[5];
enc[4]=d[6];
enc[5]=(~d[2]&~d[1]&~d[4])(d[2]&~d[0])(d[1]&~d[0]);
enc[6]=(~d[2]&~d[1]&~d[4])(d[2]&d[0])(d[1]&d[0]);
enc[7]=d[4];
enc[8]=d[7];

wherein enc[i] is the (i+)-th digit in the 9-bit data, 8≥i≥0, and i is an integer; d[ ] is the (j+1)-th digit in the 8-bit data, 7≥j≥0, and j is an integer; and ~ represents performing an inversion operation, & represents performing an AND operation, and | represents performing an OR operation.

12. The device as claimed in claim 10, wherein when the tenth digit of data is 1, it indicates that the 9-bit data has undergone the inversion operation, and when the tenth digit of data is 0, it indicates that the 9-bit data has not undergone the inversion operation, and wherein the encoder is further configured for:

detecting whether the first digit of data of the 9-bit data is 0 when the to-be-encoded byte is the first byte of the to-be-transmitted data;

inverting the 9-bit data and then adding the tenth digit of data for indicating that the inverted 9-bit data has undergone the inversion operation behind the inverted 9-bit data to obtain the 10-bit data if the first digit of data is 0; and adding the tenth digit of data for indicating that the 9-bit data has not undergone the inversion operation behind the 9-bit data to obtain the 10-bit data if the first digit of data is not 0.

13. The device as claimed in claim 10, wherein when the tenth digit of data is 1, it indicates that the 9-bit data has undergone the inversion operation, and when the tenth digit of data is 0, it indicates that the 9-bit data has not undergone the inversion operation, and wherein the device further comprises:

a processor for adding a first identification code at a preset position of the encoded to-be-transmitted data to obtain target data, the first identification code being preset 10-bit data, the first identification code comprising at least 6 consecutive digits of identical data, the first identification code being used for identifying transmitted content, start of transmission or end of transmission, and the encoded to-be-transmitted data comprising the 10-bit data obtained by encoding the 8-bit data corresponding to the to-be-encoded byte; and a sender for sending the target data.

14. The device as claimed in claim 13, wherein the processor is specifically configured for:

combining the first identification code and a second identification code into a combined code, both the first identification code and the second identification code being preset 10-bit data and comprising at least 6 consecutive digits of identical data, and the second identification code being different from the first identification code; and adding the combined code at a preset position of the encoded to-be-transmitted data to obtain the target data.

15. A signal transmission system including a timing controller and a source driver chip, the timing controller comprising the encoding device as claimed in claim 10, and the source driver chip comprising:

a detector for detecting a tenth digit of data of to-be-decoded 10-bit data, the tenth digit of data being used for indicating whether a first 9 bits of data in the to-be-decoded 10-bit data have undergone an inversion operation; and a decoder for:

inverting the first 9 bits of data to obtain pre-decoded 9-bit data if the tenth digit of data indicates that the first 9 bits of data have undergone the inversion operation;

taking the first 9 bits of data as the pre-decoded 9-bit data if the tenth digit of data indicates that the first 9 bits of data have not undergone an inversion operation; and decoding the pre-decoded 9-bit data into 8-bit data, wherein all of the 8-bit data, the 9-bit data and the 10-bit data are binary data.

16. A signal transmission system including a timing controller and a source driver chip, the source driver chip comprising the encoding device as claimed in claim 10, and the timing controller comprising:

a detector for detecting a tenth digit of data of to-be-decoded 10-bit data, the tenth digit of data being used for indicating whether a first 9 bits of data in the to-be-decoded 10-bit data have undergone an inversion operation; and a decoder for:

inverting the first 9 bits of data to obtain pre-decoded 9-bit data if the tenth digit of data indicates that the first 9 bits of data have undergone the inversion operation;

taking the first 9 bits of data as the pre-decoded 9-bit data if the tenth digit of data indicates that the first 9 bits of data have not undergone an inversion operation; and decoding the pre-decoded 9-bit data into 8-bit data, wherein all of the 8-bit data, the 9-bit data and the 10-bit data are binary data.

17. A decoding device comprising:

a detector for detecting a tenth digit of data of to-be-decoded 10-bit data, the tenth digit of data being used for indicating whether a first 9 bits of data in the to-be-decoded 10-bit data have undergone an inversion operation; and a decoder for:

inverting the first 9 bits of data to obtain pre-decoded 9-bit data if the tenth digit of data indicates that the first 9 bits of data have undergone the inversion operation;

taking the first 9 bits of data as the pre-decoded 9-bit data if the tenth digit of data indicates that the first 9 bits of data have not undergone the inversion operation; and decoding the pre-decoded 9-bit data into 8-bit data, wherein all of the 8-bit data, the 9-bit data and the 10-bit data are binary data.

18. The device as claimed in claim 17, wherein at least one of any 5 consecutive digits of the pre-decoded 9-bit data is different from the other digits, and the decoder is specifically configured for:

decoding the pre-decoded 9-bit data into the 8-bit data as follows:

Dout[7]=d_code[8];
Dout[6]=d_code[4];
Dout[5]=d_code[3];
Dout[4]=d_code[7];
Dout[3]=d_code[0];
Dout[2]=(d_code[6]^d_code[5])&~(~d_code[2]&d_code[1]);
Dout[1]=(d_code[6]^d_code[5])&~(d_code[2]&~d_code[1]);
Dout[0]=(d_code[6]&~d_code[5])(d_code[6]&d_code[5]&d_code[2])|(~d_code[6]&~d_code[5]&d_code[2]);

wherein d_code[i] is the (i+)-th digit in the pre-decoded 9-bit data, $8 \geq i \geq 0$, and i is an integer; Dout[j] is the (j+1)-th digit in the 8-bit data, $7 \geq j \geq 0$, and j is an integer; and ^ represents performing an exclusive OR operation, ~ represents performing an inversion operation, & represents performing an AND operation, and | represents performing an OR operation.

19. The device as claimed in claim 17, wherein when the tenth digit of data is 1, it indicates that the 9-bit data has undergone the inversion operation, and when the tenth digit of data is 0, it indicates that the 9-bit data has not undergone the inversion operation, and wherein the device further comprises:

a receiver for receiving target data; and a processor for determining to-be-decoded data according to a first identification code when it is detected that the target data comprises the first identification code, the to-be-a decoded data comprising at least one set of the to-be-decoded 10-bit data, the first identification code being preset 10-bit data, the first identification code comprising at least 6 consecutive digits of identical data, and the first identification code being used for identifying transmitted content, start of transmission or end of transmission.

20. The device as claimed in claim 19, wherein when the tenth digit of data is 1, it indicates that the 9-bit data has undergone the inversion operation, and when the tenth digit of data is 0, it indicates that the 9-bit data has not undergone the inversion operation, and wherein:

the processor is further configured for determining the first identification code according to a combined code when it is detected that the target data comprises the combined code, and determining the to-be-decoded data according to the first identification code, wherein the combined code is obtained by combining the first identification code and a second identification code, the first identification code and the second identification code are preset 10-bit data and both comprise at least 6 consecutive digits of identical data, and the second identification code is different from the first identification code.

* * * * *